(12) United States Patent
Kim et al.

(10) Patent No.: US 7,601,646 B2
(45) Date of Patent: Oct. 13, 2009

(54) TOP-OXIDE-EARLY PROCESS AND ARRAY TOP OXIDE PLANARIZATION

(75) Inventors: Deok-kee Kim, Wappingers Falls, NY (US); Ramachandra Divakaruni, Ossining, NY (US); Hiroyuki Akatsu, Yorktown Heights, NY (US); George Worth, Gardiner, NY (US); Jay Strane, Chester, NY (US); Byeong Kim, Chester, NY (US)

(73) Assignee: International Business Machines Corporation, Armonk, NY (US)

( * ) Notice: Subject to any disclaimer, the term of this patent is extended or adjusted under 35 U.S.C. 154(b) by 927 days.

(21) Appl. No.: 10/710,566

(22) Filed: Jul. 21, 2004

(65) Prior Publication Data

US 2006/0019443 A1    Jan. 26, 2006

(51) Int. Cl.
H01L 21/3065 (2006.01)
H01L 21/308 (2006.01)
H01L 21/311 (2006.01)

(52) U.S. Cl. .............................. 438/697; 257/E21.245

(58) Field of Classification Search .................. 438/239, 438/241, 697, 698, 699; 257/E21.243, E21.244, 257/E21.245, E21.246
See application file for complete search history.

(56) References Cited

U.S. PATENT DOCUMENTS

| | | | |
|---|---|---|---|
| 5,780,339 A | 7/1998 | Liu et al. | |
| 5,883,006 A | 3/1999 | Iba | |
| 5,895,946 A | 4/1999 | Hamamoto et al. | |
| 6,100,138 A | 8/2000 | Tu | |
| 6,103,623 A | 8/2000 | Lien et al. | |
| 6,124,165 A | 9/2000 | Lien | |
| 6,165,839 A | 12/2000 | Lee et al. | |
| 6,403,494 B1 | 6/2002 | Chu et al. | |
| 6,429,068 B1 | 8/2002 | Divakaruni et al. | |
| 6,509,226 B1 | 1/2003 | Jaiprakash et al. | |
| 6,576,526 B2 | 6/2003 | Kai et al. | |
| 6,617,213 B2 | 9/2003 | Hummler | |
| 6,617,245 B2 | 9/2003 | Ueda | |
| 6,620,677 B1 | 9/2003 | Hummler | |
| 6,673,686 B1 | 1/2004 | Scholz et al. | |
| 6,709,924 B1 | 3/2004 | Yu et al. | |
| 6,716,764 B1 | 4/2004 | Girard et al. | |
| 6,730,980 B2 | 5/2004 | Rhodes | |
| 6,837,965 B2 * | 1/2005 | Gustafson et al. | 156/345.25 |
| 2003/0143809 A1 | 7/2003 | Hummler | |
| 2003/0186502 A1 | 10/2003 | Malik et al. | |
| 2004/0033659 A1 | 2/2004 | Seitz et al. | |
| 2004/0075111 A1 | 4/2004 | Chidambarrao et al. | |

* cited by examiner

*Primary Examiner*—Lynne A. Gurley
*Assistant Examiner*—Andrew O. Arena
(74) *Attorney, Agent, or Firm*—Whitham, Curtis, Christofferson & Cook, P.C.

(57) ABSTRACT

Manufacturing yield of integrated circuits having differentiated areas such as array and support areas of a memory is improved by reducing height/step height difference between structures in the respective differentiated areas and is particularly effective in conjunction with top-oxide-early (TOE) and top-oxide-late processes. A novel planarization technique avoids damage of active devices, isolation structures and the like due to scratching, chipping or dishing which is particularly effective to improve manufacturing yield using TON processes and also using TOE and TOL processes when average height/step height is substantially equalized. Alternative mask materials such as polysilicon may also be used to simplify and/or improve control of processes.

4 Claims, 29 Drawing Sheets

TOP-OXIDE-EARLY PROCESS AND ARRAY TOP OXIDE PLANARIZATION

BACKGROUND OF INVENTION

The present invention generally relates to the manufacture of integrated circuits and, more particularly, to the manufacture of integrated circuits having different functional areas requiring different processing and/or requiring planarizing processes.

Increased density and proximity of both active and passive electronic device structures in an integrated circuit have been recognized to provide benefits in both performance and functionality of integrated circuits. For example, reduced lengths of signal propagation paths allow operation at higher clock rates while reducing susceptibility to noise. Increased numbers of devices on a single chip also generally support such improved performance while allowing a greater number and variety of circuit functions to be provided such as local voltage regulation and conversion, local memory and additional logic circuitry or coprocessors for microprocessors, non-volatile storage, redundant circuitry, self-test arrangements and many other types and combinations of circuits. Even entire systems can be provided on a single chip for increasing numbers of applications. As an additional benefit of increased integration density, an increased number of different functional circuits generally tends to reduce the number of external connections which must be made to a given chip; a requirement which has presented substantial difficulty in many chip designs.

However, such increases in integration density and performance requires that individual electronic device structures be substantially optimized, at least in groups, in accordance with the respective functions they must perform and it is generally convenient and more economical to arrange such groups of devices in respective, differentiated areas of the chip. For example, the storage cells of a memory, collectively referred to as the array section of a memory, require very different electronic device (e.g. transistor) properties and technologies from the transistor circuits necessary to decode an address and/or carry out reading, writing and refresh operations, collectively referred to as the support section of a memory. By the same token, devices in the support section differ substantially between dynamic, static and non-volatile memory structures as well as differing substantially from devices in logic arrays, processors and the like and may operate at very different voltages and clock speeds and require much different technologies and processes to manufacture.

For DRAM cells with vertical MOSFET array devices, an array top oxide (ATO) is needed to isolate the passing word lines from active areas on the substrate. Typical processes for forming such isolating ATO areas include forming an array top oxide layer in the presence of a pad nitride layer of the DRAM. A variety of methods are known in the art for forming array top oxides and are referred to as top oxide early (TOE), top oxide nitride (TON) and top oxide late (TOL) processes.

More generally, it is common in current semiconductor manufacturing processes to use nitride (e.g. a pad nitride) to achieve certain desired shapes in semiconductor device structures and then replace the nitride with another material. Such processes are facilitated by the selectivity of some known processes which allow nitride to be selectively etched or selectively allowed to remain while etching other materials. Nitride may also be convenient since it can be used as an etch stop or polish stop in some processes. In the case of chips having vertically arranged array devices and support sections, the nitride is removed and replaced with high quality oxide in the array area to isolate the passing word line (WL) connection array from active areas on the substrate but replaced with polysilicon in the support area to form gates of the switching transistors therein. The oxide formed over the array area is referred to as an array top oxide (ATO) and its formation is relatively critical since open or short failures can be caused by a slight lack of process control, the potential for capacitive coupling and the extremely close spacing of the capacitors and the word lines and bit lines which must be formed at a similarly close spacing. The ATO can be formed either before or after the polysilicon and several different process sequences have been developed; each having certain advantages and disadvantages. A process in which the ATO is formed after formation of the polysilicon is referred to as top-oxide-late (TOL) which requires chemical-mechanical polishing to the polysilicon gates in the support areas which may compromise such structures by scratching. Another process is referred to as top-oxide-nitride (TON) in which an array top oxide area is deposited after the pad nitride has been stripped in both the array and support areas. The array top oxide is planarized. Array top oxide is then removed in the support area followed by sacrificial oxidation, support implants, gate oxidation and deposition of a gate polysilicon layer. However, the TON process results in relatively wide, open areas without polish stops which aggravates dishing during planarization as will be discussed in greater detail below. The nitride is removed simultaneously in both the array and support areas in both the TOL and TON processes. Conversely, a process in which the nitride is removed in the array area with a block mask and the ATO is formed prior to removal of nitride in the support area is referred to as top-oxide-early (TOE) but has the disadvantage that relatively more masks are required than in the TOL and TON processes.

While one lithographic exposure is invariably necessary to establish basic locations and dimensions for electronic elements to be fabricated in integrated circuits, it is also generally necessary to make at least one lithographic exposure in each differentiated functional area of a chip having a plurality of such areas. It is also necessary to make at least one, if not several, lithographic exposures to form conductors or other so-called back-end-of-line (BEOL) processes to complete a given chip design. For most of these lithographic exposures and lithographic exposures for BEOL processes, in particular, it is generally necessary and at least highly desirable to have the semiconductor structure which has been formed to that point in the manufacturing process to be highly planar in order to achieve optimal lithographic pattern resolution. Planarization is also used for other purposes such as formation of structures in trenches, isolation structures and Damascene conductors.

Planarization has been performed predominantly by mechanical polishing using a slurry of extremely fine abrasive and sometimes assisted by chemical constituents of the slurry, referred to as chemical-mechanical polishing (CMP). However, polishing processes such as CMP, while well-developed and mature, are imperfect and may cause several different types of undesirable artifacts. One type of artifact is scratching which may occur due to a relatively larger grain of abrasive or a particle broken, chipped or abraded from the wafer being polished. Scratching has become more critical in recent generations of extremely high density integrated circuit devices in which individual electronic elements are made smaller and more delicate. Scratching of insulator material and isolation structures may give rise to significant current leakage. Major portions of isolation material, transistors and memory capacitors have been observed to be physically removed by scratches. Another artifact of CMP is dishing in areas of lesser surface hardness and which can be aggravated by relatively larger areas of softer material. Dishing may be avoided in some cases by placement of areas of a hard material such as a nitride, commonly used as a preferred polish stop. However, such a strategy may be incompatible with the process requirements for a particular design such as a top oxide nitride (TON) process used in memory chip manufacture alluded to above.

In modern integrated circuits and for an array top oxide structure, in particular, good uniformity and planarity within a tolerance of 15 nm is generally required and conventional CMP processes do not meet such a stringent specification due to scratches, dishing or other artifacts. At the same time, dishing is aggravated by the topographies of differing heights in the respective array and support areas without polish stops. Further, to avoid lengthy polishing processes having increased risk of artifact production, the surface to be planarized must not exhibit severe topography and the material to be planarized must be substantially planar and of relatively uniform thickness prior to the polishing process. In summary, planarization, in general, and formation of ATO, including its planarization, in particular, is a major obstacle to obtaining acceptable manufacturing yield in high density integrated circuits having a plurality of functional areas. Current known processes have not met required tolerances for planarity of ATO and defects due to scratching damage to circuit element structures, isolation structures and insulating material surfaces.

SUMMARY OF INVENTION

It is therefore an object of the present invention to provide improved protection for differentiated areas of a chip during manufacture in combination with structures of reduced height of structures and reduced height difference between differentiated areas of the chip.

It is another object of the invention to provide a method for planarization of a chip surface and an array top oxide, in particular, having reduced susceptibility to engendering chip defects and improved manufacturing yield.

It is a further object of the invention to provide an alternative to polishing processes for planarization and which is capable of meeting a 15 nm uniformity tolerance.

It is yet another object of the invention to provide an integrated circuit chip having a plurality of functional areas which can be fabricated with increased manufacturing yield and much reduced incidence of picture frame defects and foreign material faults.

In order to accomplish these and other objects of the invention, a method for manufacture of an integrated circuit having structures of different heights formed in respective first and second areas thereon is provided comprising steps of masking the first area of the surface having structures formed thereon, etching isolation structures in the second area of the surface to reduce height thereof, removing material from at least the first area, depositing material on the surface, including surfaces of the isolation structures and in regions where material was removed by the removing step, depositing isolation material on the first and second areas, planarizing the isolation material to the surface, removing material from the second area of the surface and forming active devices thereon, and forming structures from the active devices to the structures formed in the first area of the surface across the isolation material planarized in the planarizing step.

In accordance with another aspect of the invention a method for planarizing a surface having structures and an additional layer of material covering said surface formed thereon is provided including steps of applying a planarizing material to the layer of material to form a substantially planar surface above the surface having structures formed thereon, and performing a non-selective etching from the substantially planar surface to a structure formed on the surface or, more generally, applying a planarizing material to said body of material to form a substantially planar surface, and performing a nonselective etching from said substantially planar surface to a point on or within said body of material.

The invention comprises a number of process features which provide improvements in integrated circuit quality and manufacturing yield and will be described in connection with three embodiments, each discussing features of the invention in preferred combinations and in connection with the preferred environment process for use of those features. As will be understood by those skilled in the art, these features of the invention may be used singly or in different combinations in regard to different processes (e.g. top oxide early (TOE), top oxide nitride (TON), top oxide late (TOL) and even more general processes such as planarization) to provide improved integrated circuits which can be manufactured with enhanced manufacturing yield. The first embodiment, illustrated in FIGS. 1-9, provides improvements over known TOE processes by using an optional support liner (nitride, polysilicon, etc.) with an oxide hard mask which provides improved protection for the support area and allows improved control over isolation trench structure height. (A TOE process with a support liner is disclosed in U.S. Pat. No. 6,620,677 to Hummler, which is hereby fully incorporated by reference.) A deglazing step prior to application of the liner and oxide hard mask reduces the average height of the array and support areas compared to the known TOE process. A polysilicon hard mask instead of the optional support liner and the oxide hard mask may also be used in accordance with the first embodiment of the invention for process simplification and improved control since a wet etch is required to remove oxide and nitride in the array area. Oxide and nitride in the array area can be easily removed with one polysilicon hard mask. Using one polysilicon hard mask, the step height difference between the array and support areas is less and array top oxide planarization is thus facilitated. The second embodiment of the invention, illustrated in FIGS. 1 and 10-14B provides a planarization technique which is an alternative to chemical/mechanical polishing (CMP) which provides improved planarity while avoiding artifacts associated with CMP and is particularly useful in TON processes which present particular problems for known planarization techniques. While the drawings illustrate this planarization process in connection with a TON process with which it is particularly advantageous, this planarization process can easily be applied to TOE and TOL processes as well. The third embodiment, which is illustrated in FIGS. 1, 3-5 and 16-22, employs etching to equalize step height in the array and support areas and provides substantial reduction of picture frame defects and foreign material faults, particularly in combination with the alternative planarization process of the second embodiment of the invention and in the environment of the first embodiment of the invention.

BRIEF DESCRIPTION OF DRAWINGS

The foregoing and other objects, aspects and advantages will be better understood from the following detailed description of a preferred embodiment of the invention with reference to the drawings, in which.

DETAILED DESCRIPTION

Figure 1:
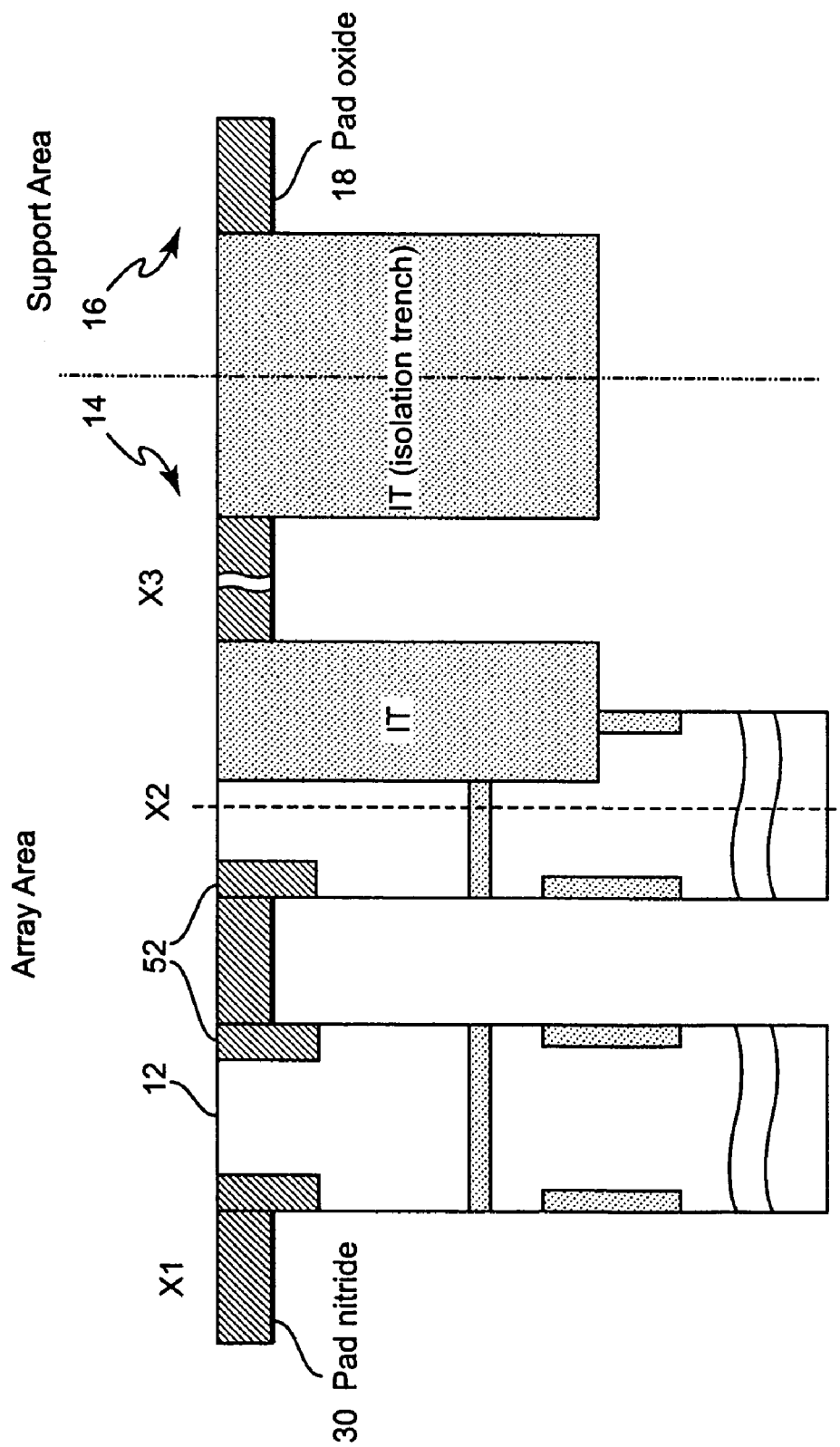
FIGS. 1 and 2 are, respectively, a cross-sectional view and a plan view of a portion of a preliminary stage of manufacture of a chip including an array area portion and a support area portion at a location of a transition there between, FIGS. 3, 4, 5, 6, 7, 8 and 9 are cross-sectional views of a chip illustrating stages of semiconductor integrated circuit fabrication in accordance with a first embodiment of employing the invention and employing a top-oxide-early (TOE) process.
Figure 2:
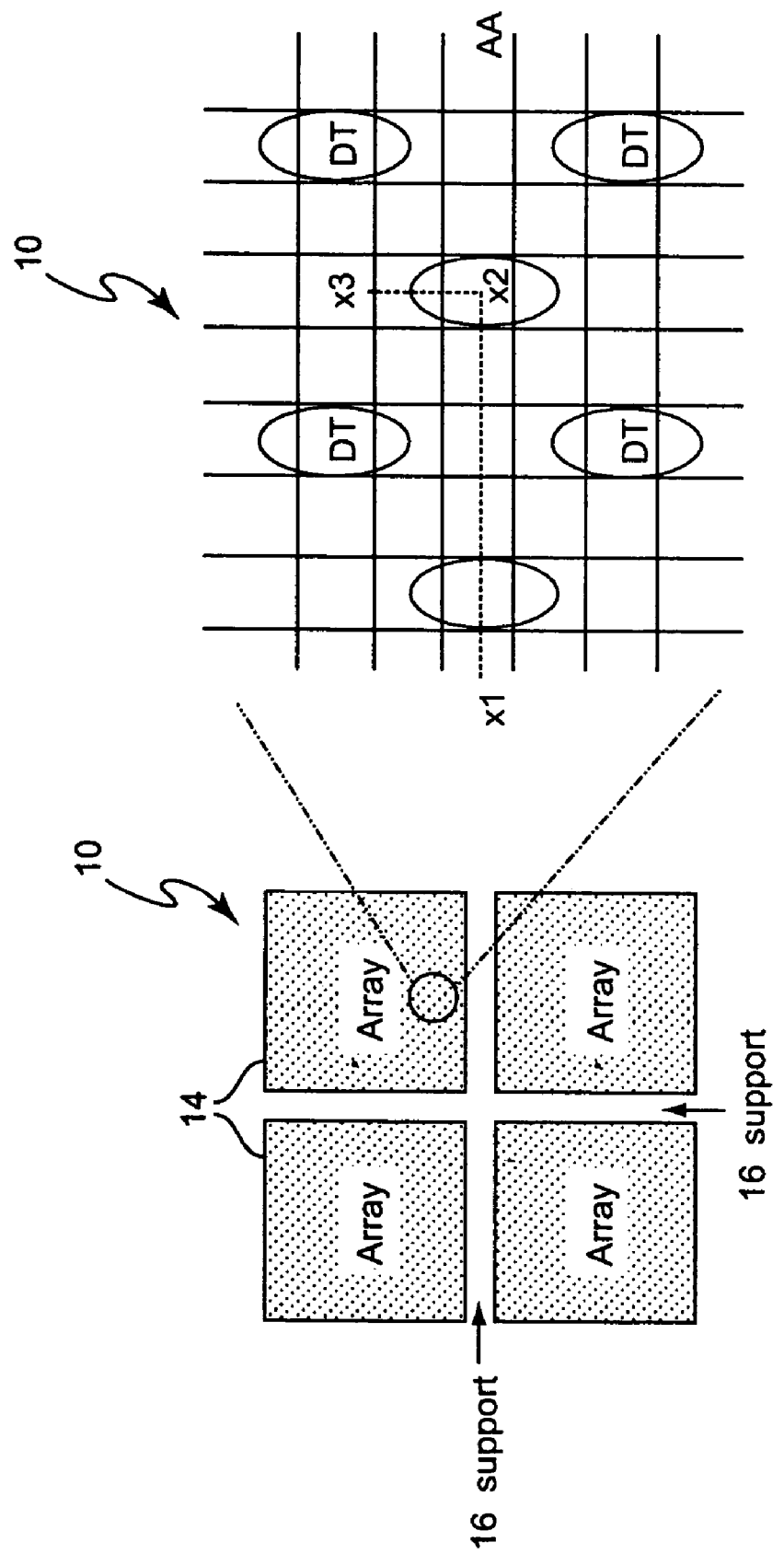

Referring now to the drawings, and more particularly to FIGS. 1 and 2, there is shown an exemplary environment for application of the invention. While the invention is not included in FIGS. 1 and 2, the structure illustrated is arranged to facilitate an understanding of the application of the invention, particularly in regard to semiconductor device fabrication and no portion of either Figure is admitted to be prior art in regard to the present invention. The structure in FIGS. 1 and 2 is principally intended to be representative of a memory structure having two differentiated major areas: an array area populated by closely spaced memory cells 12 and a support area containing, for example, addressing selection circuits (which may include, for example, a decoder, word line or bit line drivers and/or circuits for substitution of redundant portions of the array) and sense amplifier circuits. It should be understood that the structure could also represent a logic processor (corresponding to the support area) and an embedded memory (corresponding to the array area) such as dynamic random access memory (DRAM/eDRAM), possibly with vertical array MOSFET devices which result in a requirement for use of an array top oxide (ATO) to isolate the passing word line (WL) from the active regions between the memory cells 12.

As shown in FIG. 2, the memory 10, in plan view, may include a plurality of array areas 14 with support areas 16 between and adjacent to and/or surrounding them. The individual memory cells (in this case, deep trench (DT) capacitor memory cells with vertical MOSFET transistors) are preferably arranged in a pattern of rows and columns with an offset between memory cells of adjacent rows and columns to form a more densely packed array of memory cells while maintaining adequate separation between them. Isolation trench structures (IT) are employed at the boundary of the array area(s) and also within the array between the individual memory cells 12 as depicted in the sectional view of FIG. 1 along the section indicated by dashed line X1, X2, X3 of FIG. 2; the relative positions of which are also indicated in FIG. 1. FIG. 1 depicts an intermediate stage of processing in which the DT and IT structures (in this case) or, more generally, devices for a given area, have been formed and the surface has been planarized for subsequent lithographic processes in the same or another area of the chip.

Figure 3:
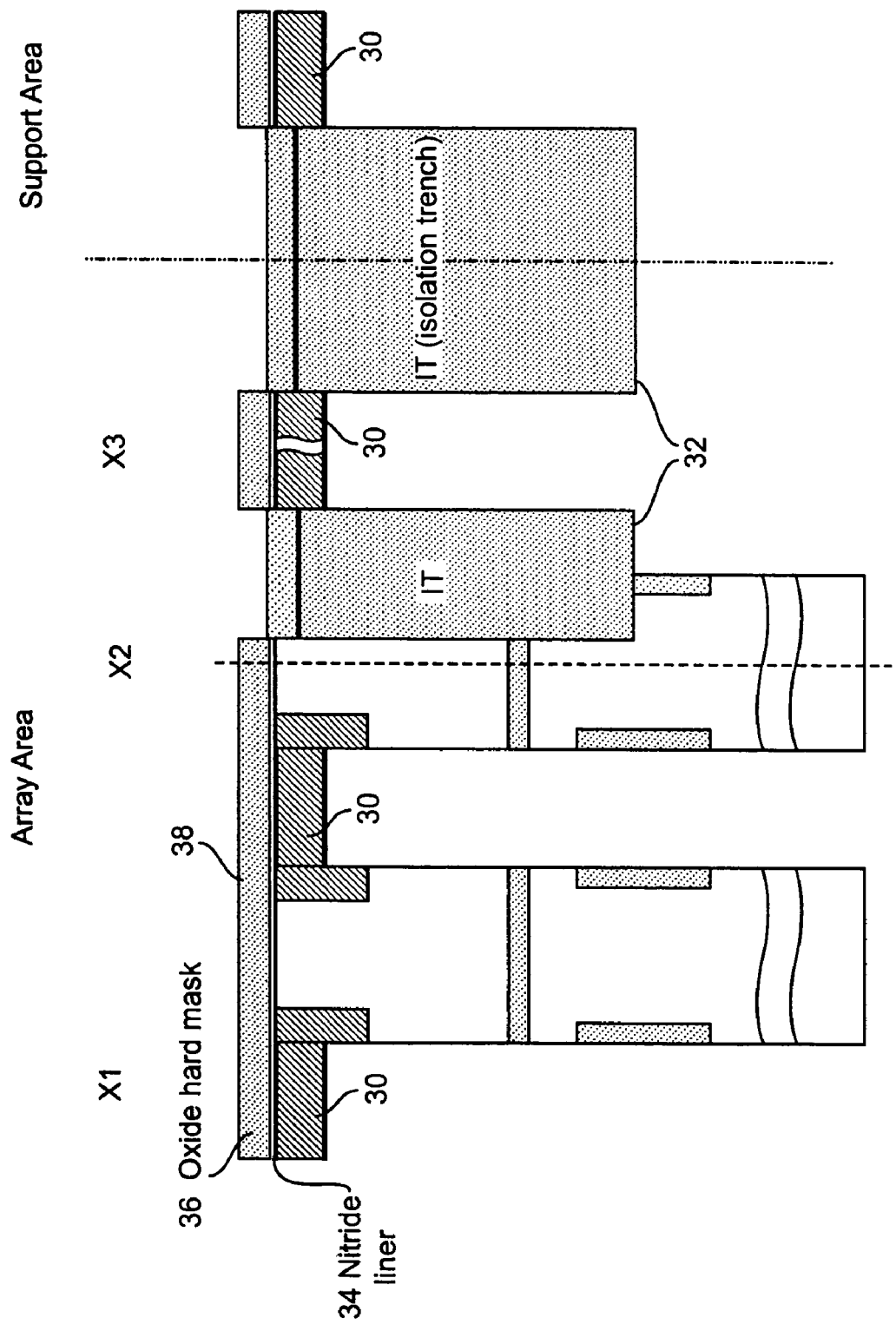

Referring now to FIGS. 3-7 application of the invention to the exemplary chip structure of FIGS. 1 and 2 in accordance with a first embodiment of the invention will be discussed. FIG. 3 shows substantially the same chip cross-section shown in FIG. 1 except that a deglazing step has been performed which recesses isolation trench structures (IT) 32 at the top surfaces thereof below the level of the memory cell 12 studs and the pad nitride 30. Such a deglazing step prior to deposition of an oxide and nitride hard mask is desirable to control the step height of the array and support areas and, as such, constitutes a significant improvement over known TOE schemes. This deglaze sets the isolation trench (IT) heights in the array and support areas independently of subsequent array top oxide (ATO) processes and facilitates ATO planarization since the amount of materials to be removed is reduced. Additionally, an optional (isotropic) nitride liner 34 and an (isotropic) oxide hard mask 36 have been applied. (The optional nitride liner, in combination with an oxide mask provides improved protection to underlying structures.) Other mask materials such as ARC, polysilicon and SOG materials can also be used for a hard mask and should be considered as illustrated by mask 36. An oxide hard mask 36 with an optional support nitride liner 34 is discussed for generality. If an oxide hard mask 36 is used, the provision of an optional support nitride liner 34 will generally be convenient as an etch stop and also to prevent undesirably undercutting of stepped portions of the surface or attacking of isolation structures. However, use of polysilicon as a hard mask instead of oxide/nitride masks to cover the support area is simpler and better controlled than use of oxide or nitride which may be wet etched in the support area during array processing whereas a polysilicon mask will not be affected by such processes and thus can be selectively maintained.

The support liner has been disclosed in the above-incorporated U.S. Pat. No. 6,620,677. However, use of one polysilicon layer instead of a two-layer hard mask (e.g. oxide/nitride) is considered to be within the scope of the present invention. If a polysilicon hard mask is used, the step height difference will be much reduced, as noted above, and will provide better protection during array processing. That is, etching of nitride and oxide during array processing also will etch a oxide/nitride hard mask but, if polysilicon liner or mask is used, the polysilicon hard mask will not be etched during array processing and thus improved protection is provided.

Figure 4:
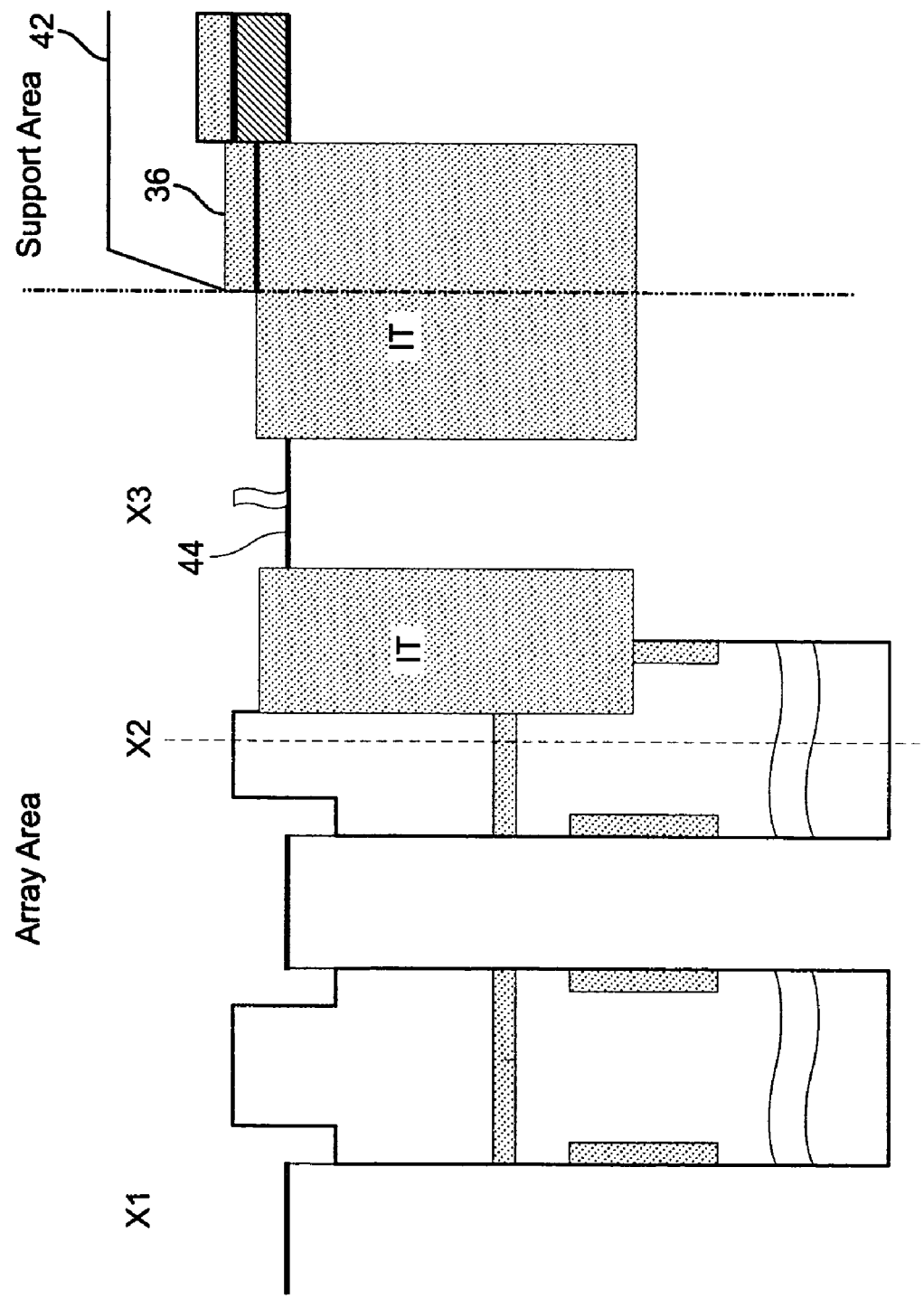

Then, as shown in FIG. 4, a resist 42 is applied and patterned such that resist remains as a block-out mask over the support area 16 but not the array area 14. The resist pattern is then transferred to the oxide layer 36 by etching to form a hard mask. The optional support nitride liner 34, nitride spacers 38 and the pad nitride 30, if applied, are etched away selectively to the oxide hard mask 36 and pad oxide is stripped and pad oxide 44 is regrown in the array area, preferably to a thickness of about 50Δ.

Figure 5:
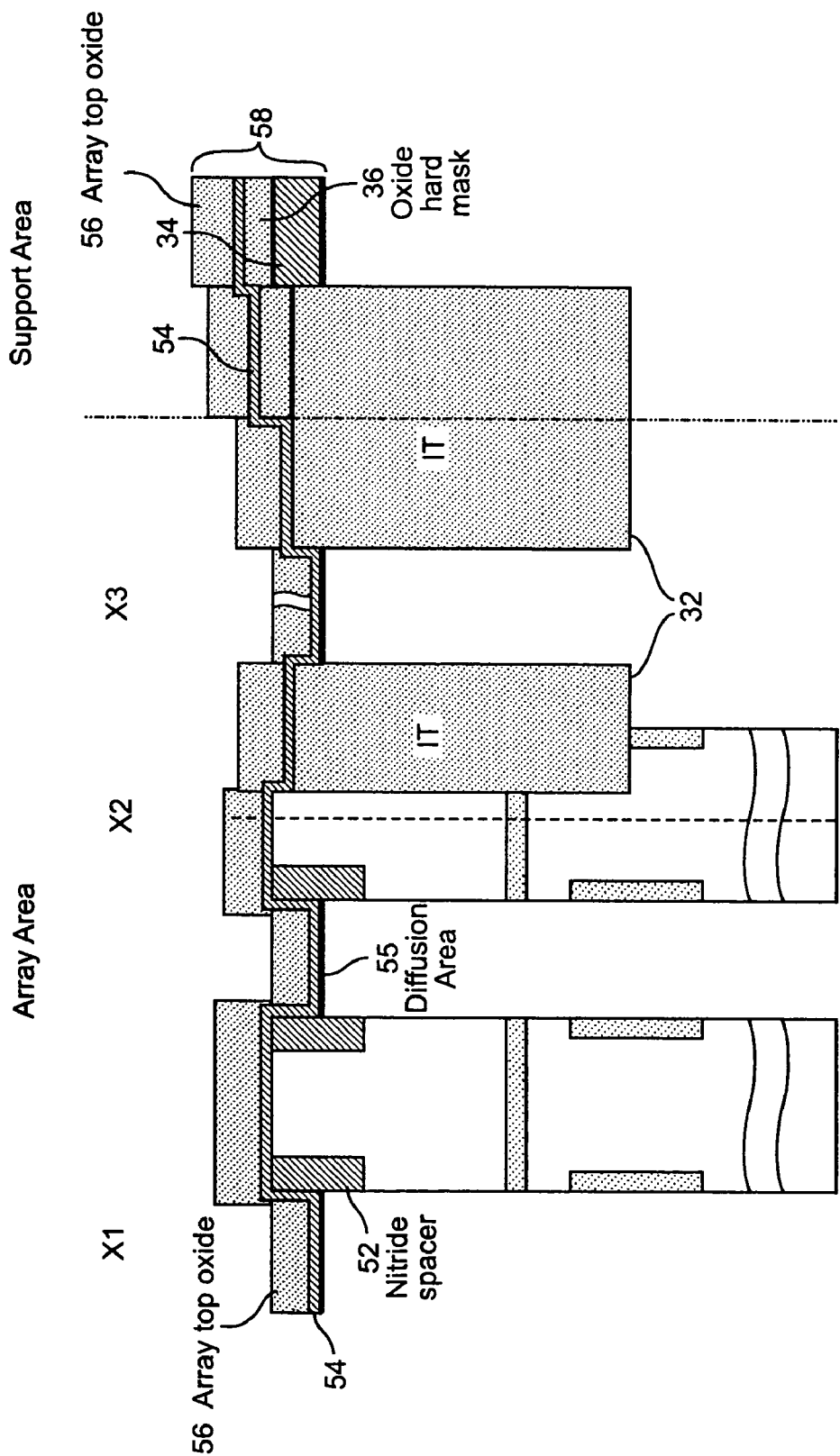

FIG. 5 shows a cross-section of the chip after a deposition and etch to form nitride spacers 52 and array implants performed. An optional array nitride liner 54 can be deposited before array top oxide (ATO) deposition and is illustrated. (This array nitride liner is not illustrated in subsequent Figures.) Such an array nitride liner is preferred to fill possible defects in the nitride spacers and/or the isolation trench structures 32 as well as providing additional protection to underlying structures in combination with an ATO layer 56 as in the layered mask structure 34, 36, as discussed above. The array top oxide (ATO) 56 is also deposited to a desired thickness, preferably about 75 nm and covers both the memory cells and active areas 55 in the array. It should be noted that the ATO 56 is also deposited on the oxide hard mask 36 in the support area. It should be noted that the height of topography in the support area, indicated by bracket 58, is now substantially greater than in the array area since the oxide hard mask, support nitride liner, pad nitride is not present in the array area but remains in the support area.

Figure 6:
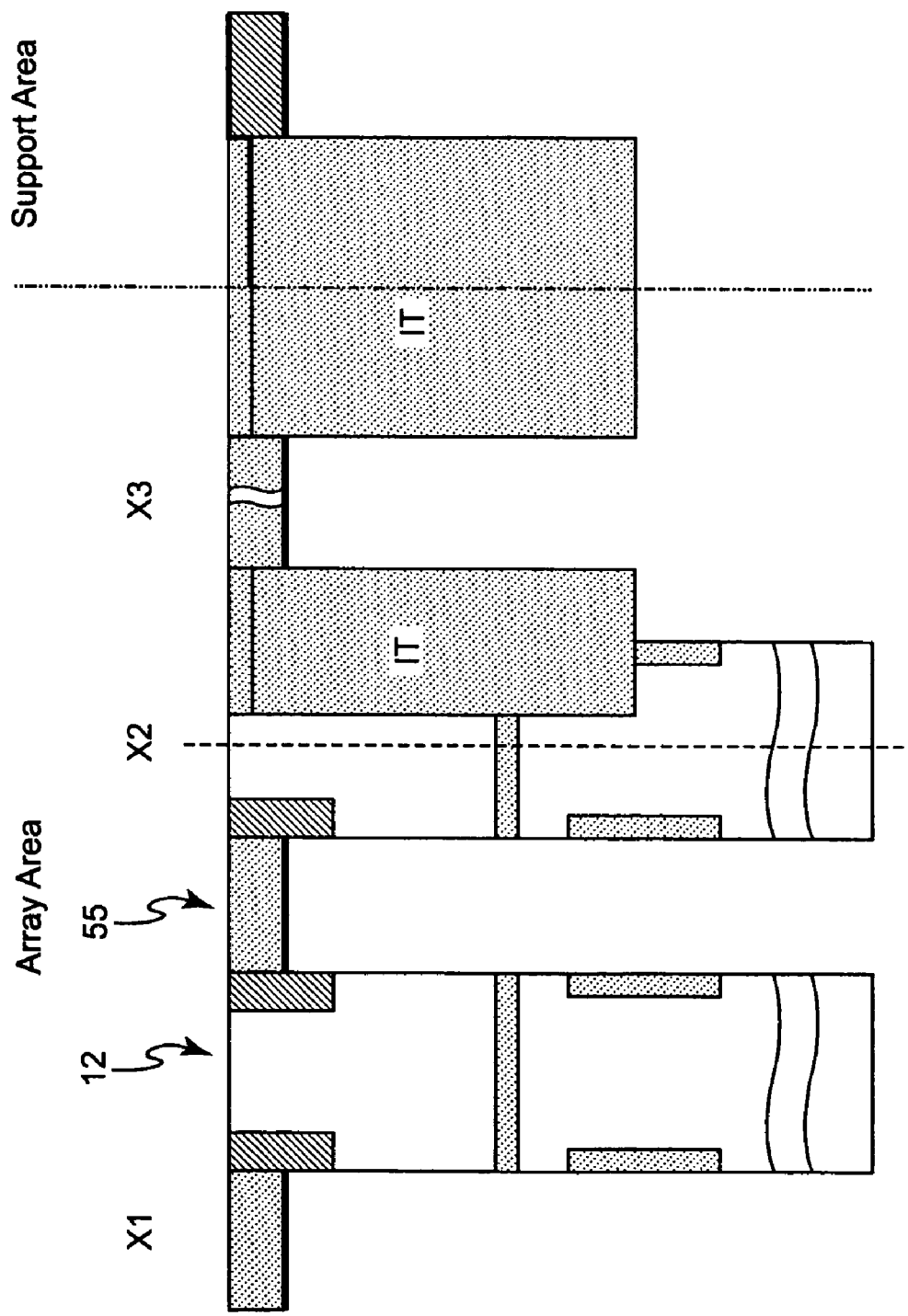

Referring now to FIG. 6, the ATO is planarized to or slightly into the ATO in active areas 55 such that the ATO is removed over the memory cells 12. As can be seen from a comparison with FIG. 5, the oxide hard mask is also removed from the support areas except where trench isolation structures were recessed in the deglazing process discussed above in regard to FIG. 3. Planarization can be performed by known CMP processes or by an ARC-assisted planarization process which will be discussed more fully in connection with the second embodiment of the invention.

Figure 7:
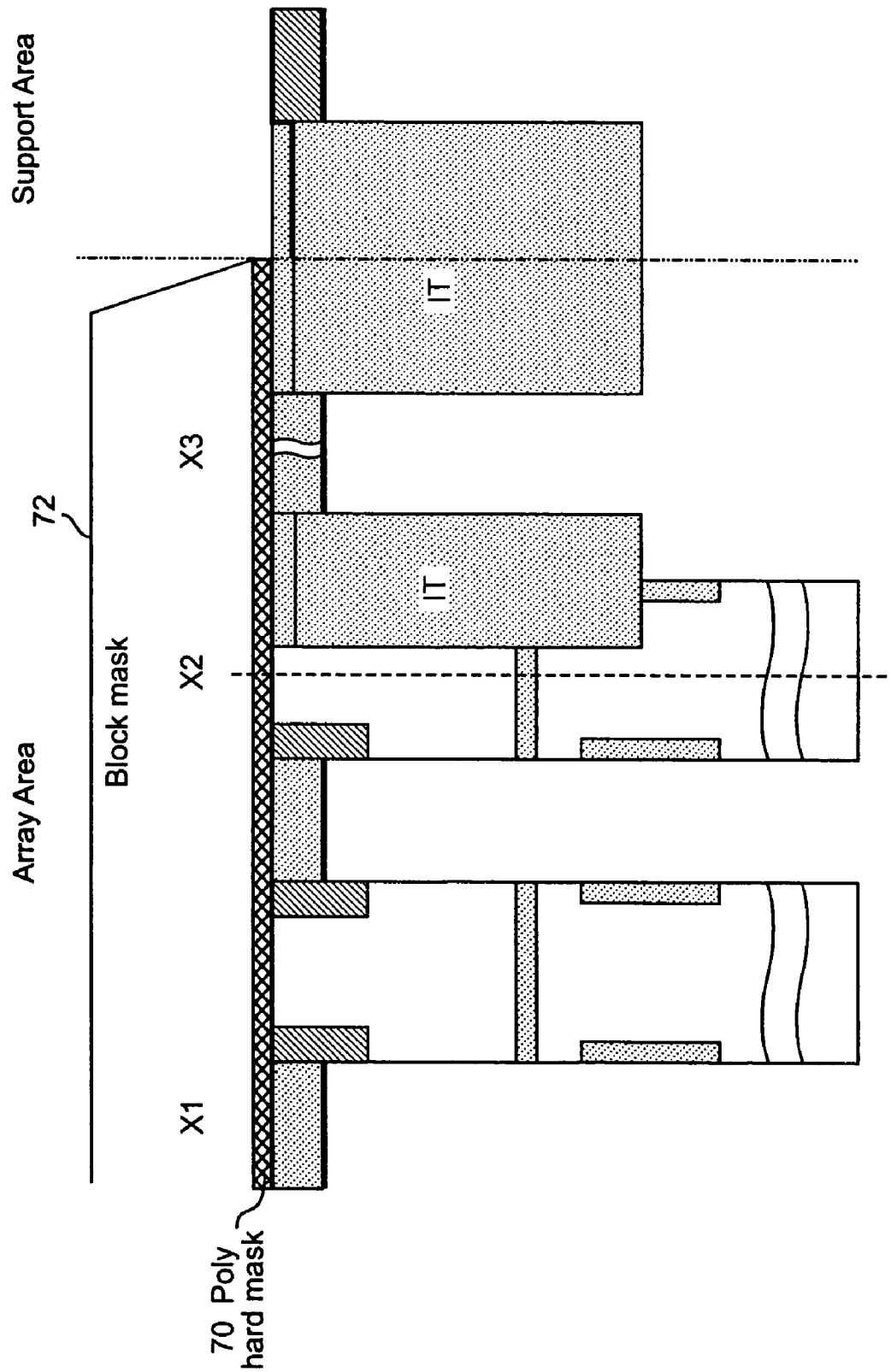
Figure 8:
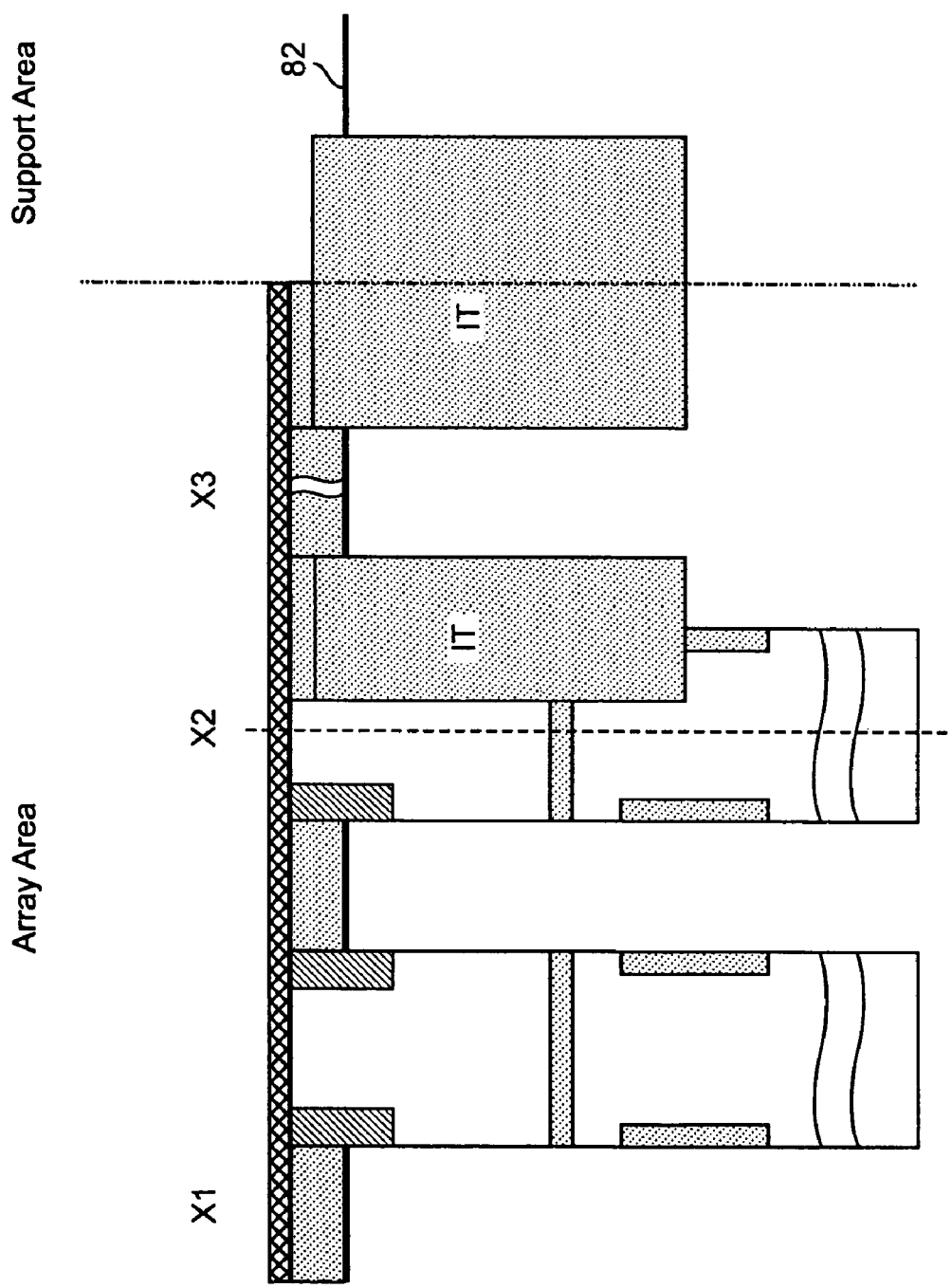
Figure 9:
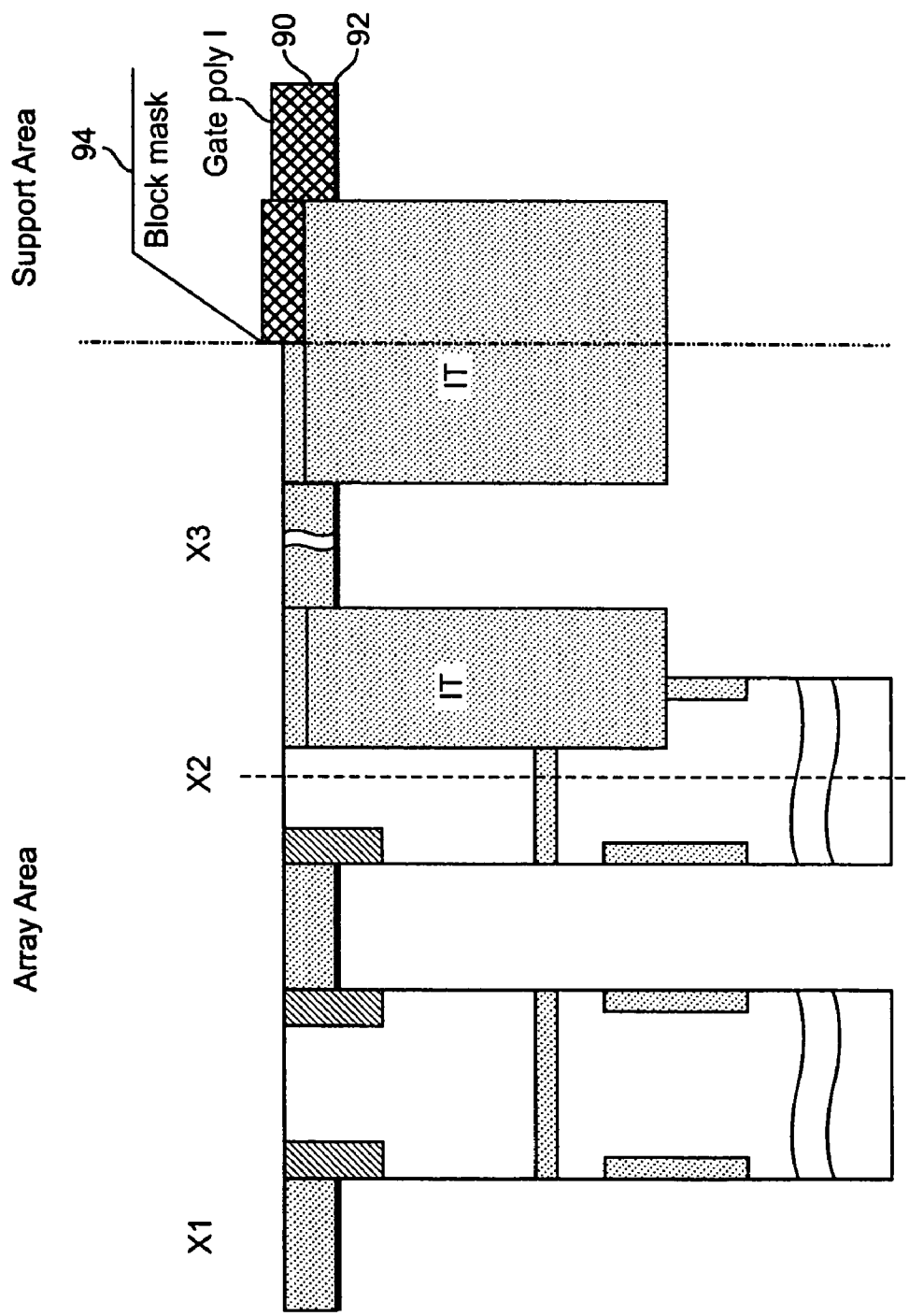

As shown in FIG. 7, a polysilicon hard mask layer 70 is deposited and a resist is applied and patterned to form a block-out mask 72. The polysilicon layer is then patterned in accordance with the block-out mask 72 to form a hard mask in the array area. Then, as shown in FIG. 8, the remaining oxide hard mask and support nitride liner in the support area are etched. The isolation trench oxide can also be etched to a desired height in the same process and pad nitride 30 and pad oxide 18 in the support area are also stripped. Sacrificial oxide 82 is then grown on exposed silicon in the support area and implants for active devices in the support area are performed. Then, as shown in FIG. 9, a layer of gate polysilicon 90 is deposited over gate oxide 92 in the support area and gate polysilicon, oxidized polysilicon and the polysilicon hard mask is removed from the array area with a block-out mask 94, leaving a planar surface in the array area as formed by the planarization, discussed above in connection with FIG. 6, suitable for formation of word lines and bit lines and other BEOL processes well-known in the art to complete the integrated circuit.

While the first embodiment of the invention provides an improved process for manufacture of semiconductor integrated circuits having differentiated areas with different processing requirements, it has been found that planarization by chemical/mechanical polishing (common to the first embodiment of the invention and known TOE processes) is not optimal and compromises manufacturing yield. Further, CMP processes provide poor planarization results for current high density integrated circuit designs, severely compromising manufacturing yield, particularly in TON processes, as alluded to above.

Figure 10:
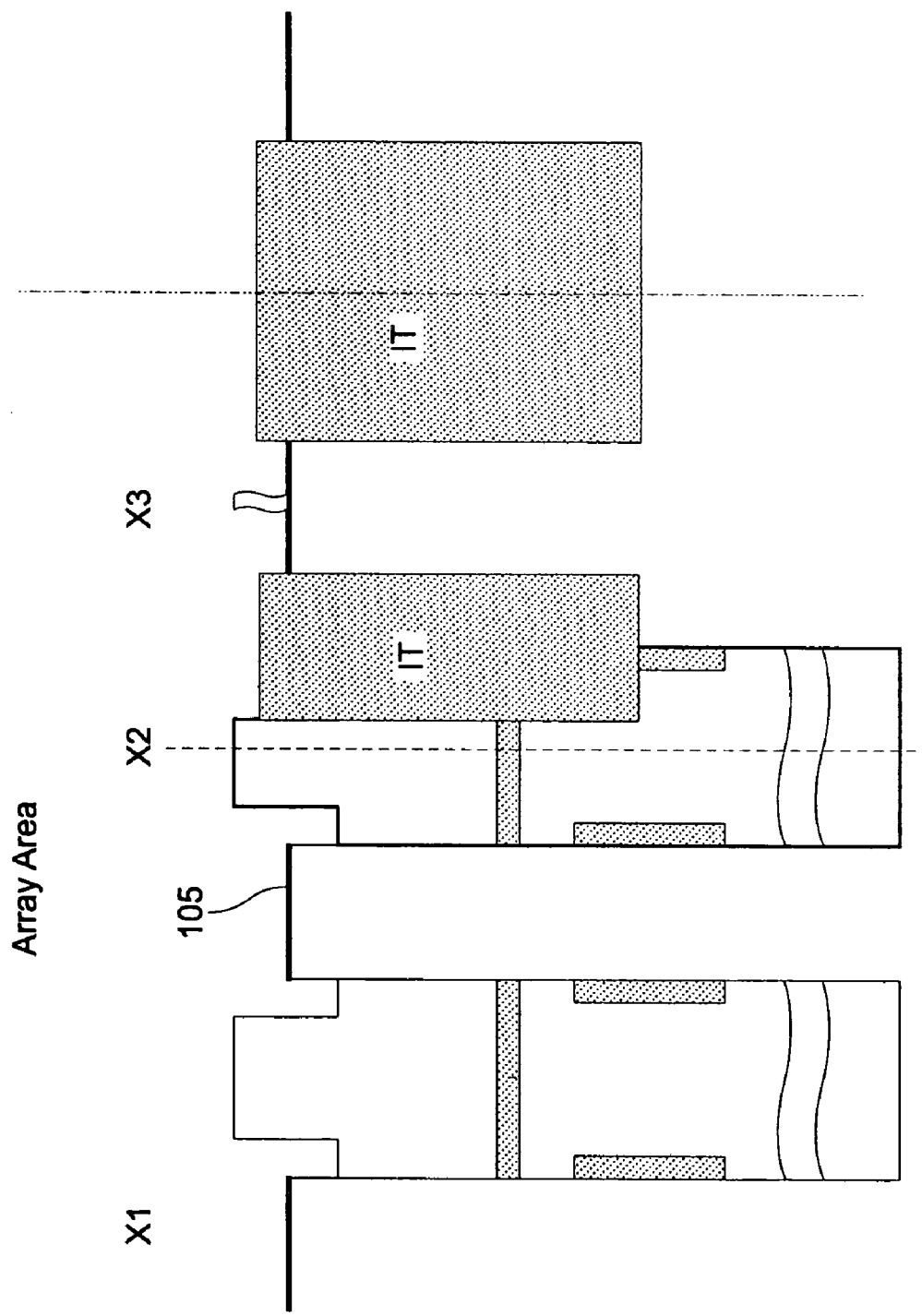
FIGS. 10, 11, 12, 13, 14A and 14B are cross-sectional views of a chip illustrating stages of semiconductor integrated circuit fabrication in accordance with a second embodiment of the invention and employing a top oxide nitride (TON) process.

In accordance with a second embodiment of the invention, starting with a structure such as that described above in connection with FIG. 1, FIG. 10 illustrates the result of deglazing (similar to that of FIG. 3) and stripping of the pad nitride and pad oxide and regrowth of pad oxide in both the support and array areas. It should be understood that the second embodiment of the invention will be described in connection with a TON process since the improvement provided by ARC-assisted planarization as compared with known CMP processes is particularly great for TON processes in which CMP performance is particularly poor while TON processes provide some substantial advantages over TOE processes, such as the requirement for fewer masking steps. Performance of the process illustrated in FIG. 10 simultaneously in both the support and array areas is, itself, a substantial simplification of the overall process compared with a TOE process. (It should be noted that FIG. 10 is similar to FIG. 4 except for the remaining oxide hard mask, support nitride and pad nitride in the support area in FIG. 4.) It should be appreciated that the ARC-assisted planarization in accordance with the invention as will be described below can be substituted for CMP processes in any semiconductor manufacturing process, including TOE and TOL processes, where planarization is required or desired.

Figure 11:
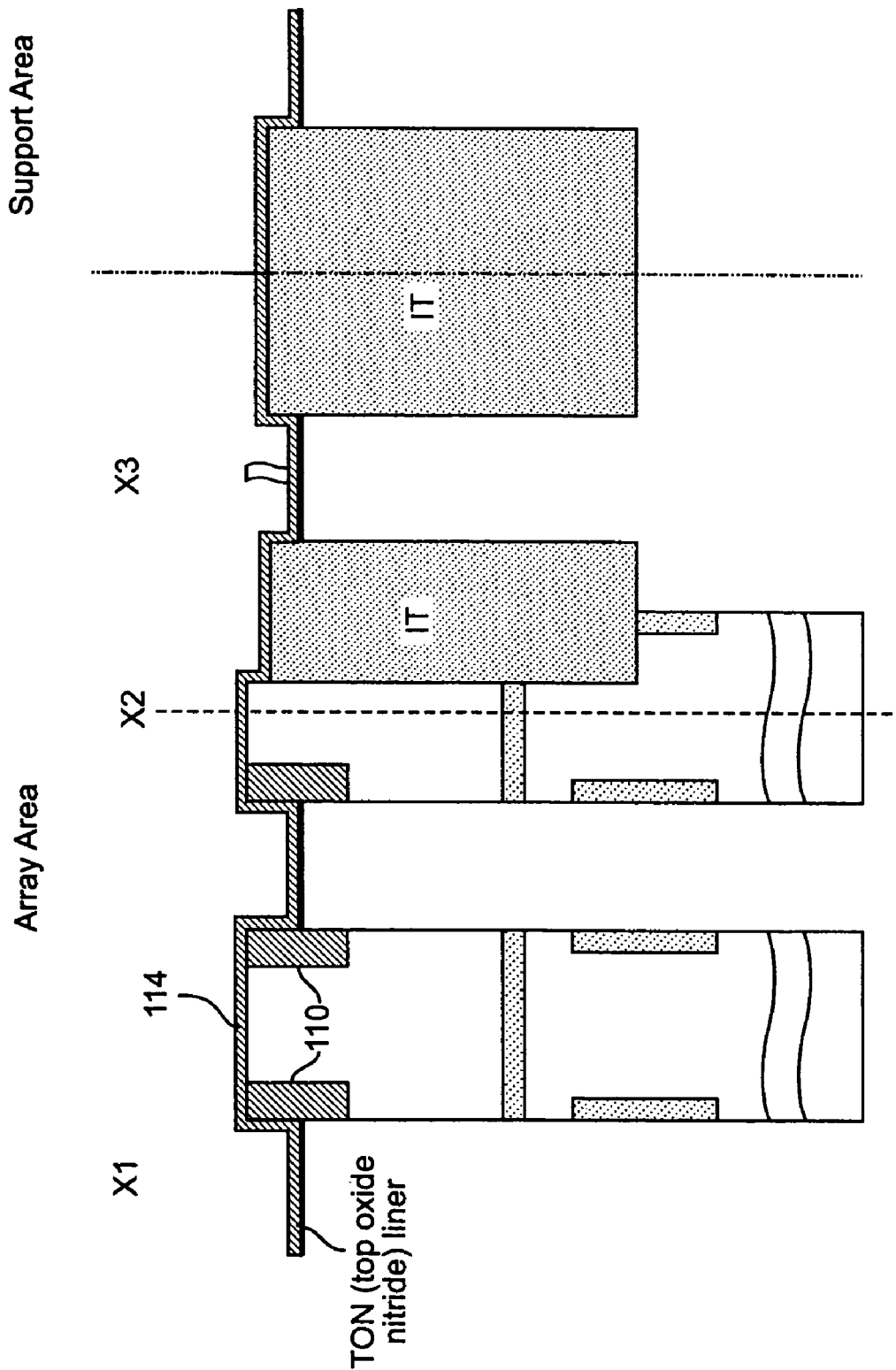
Figure 12:
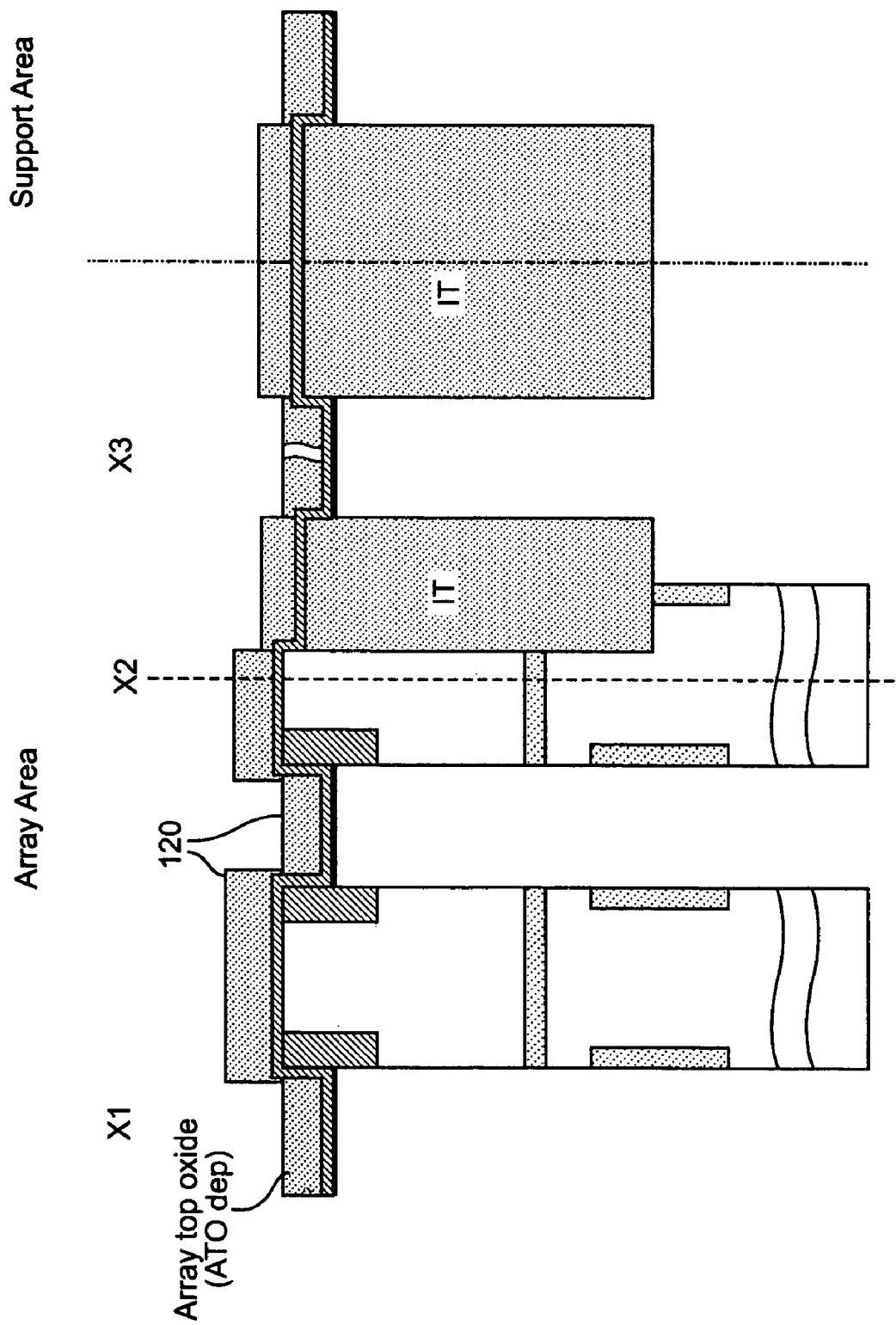

Referring now to FIG. 11, nitride spacers 110 are formed and a TON nitride liner 114, characteristic of TON processes, in general, is applied following array dopant implants in the array area. As alluded to above, TON processes have the advantage of producing a structure which is of improved quality for protecting the underlying structures by developing a layered structure of an oxide and a nitride when the ATO 120 is applied as shown in FIG. 12. The TON liner under array top oxide can fill the defects in the nitride spacer and isolation trenches and acts as an etch stop layer in the support area. It should be noted that the difference in step height between the array and support areas is small as can be appreciated by comparison of FIG. 12 with FIG. 5, discussed above; constituting a further advantage over known TOE processes as well as the first embodiment of the invention with one polysilicon array hard mask which also provides some advantage over known TOE processes in this regard. However, TON processes with ATO CMP present a major concern with TON nitride liner removal during ATO CMP due to dishing. In the TON process, dishing tends to occur in the support area during ATO CMP since relatively wide open areas with soft oxide is presented by the support area. Thus dishing in the support area during ATO CMP allows possible removal of the TON nitride liner in the support area.

Figure 13:
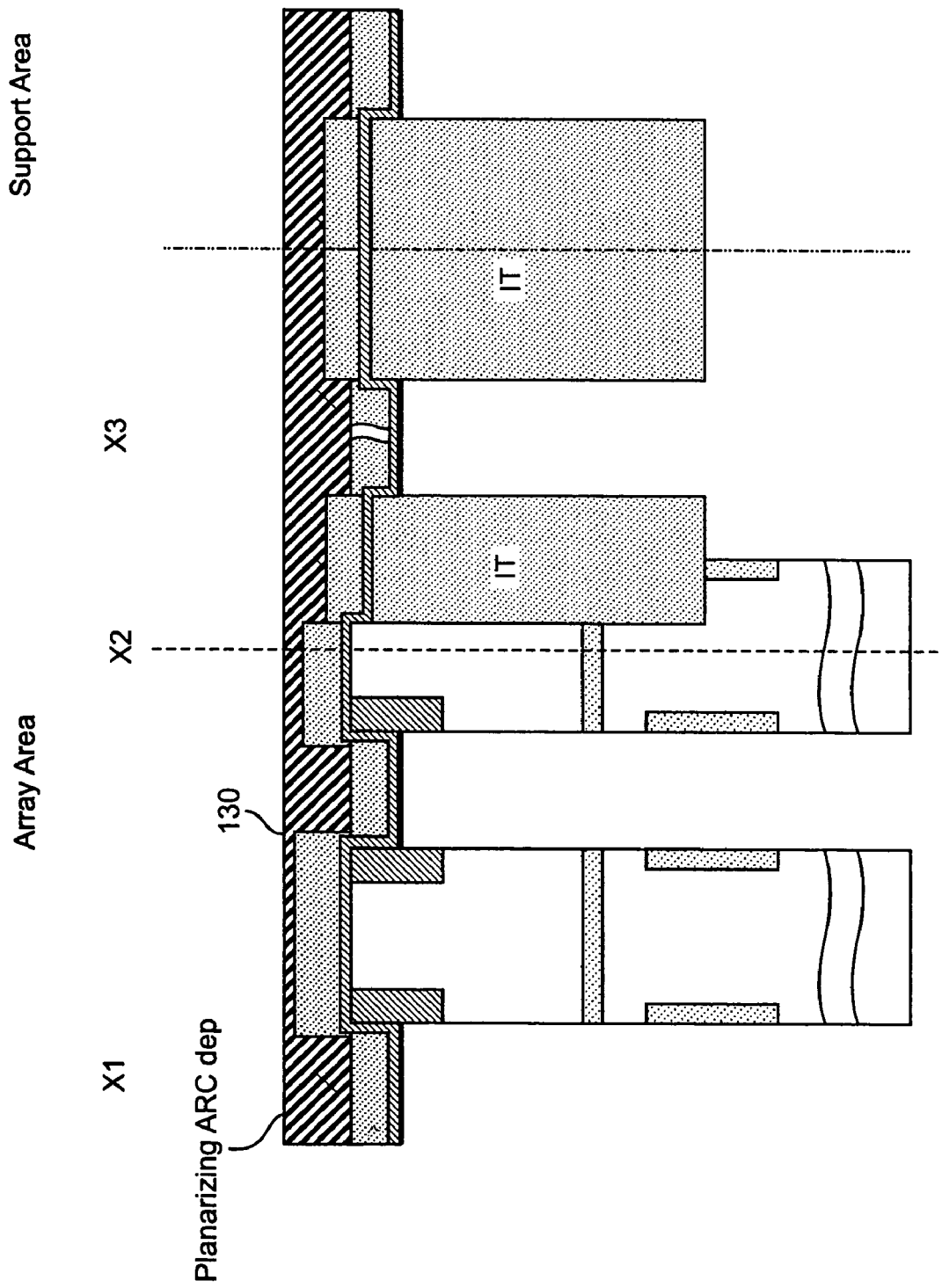

To avoid these problems, in accordance with the second embodiment of the invention as shown in FIG. 13, a planarizing anti-reflective coating (ARC) is then applied over the entire structure. While such materials as anti-reflective coating (ARC) materials, resists, spin-on glass (SOG) and the like will usually provide good uniformity and planarity, as applied, variations therefrom which preclude successful polishing to the required tolerance (e.g. 15 nm, alluded to above) have been encountered, particularly in large scale memory devices having array and support areas. Therefore, the second embodiment of the invention, in accordance with its most basic principles, planarizing material deposition and non-selective RIE, is directed to a new technique of planarization which can reliably provide the required planarity to below 15 nm and without damage to structures already formed.

Figure 14A:
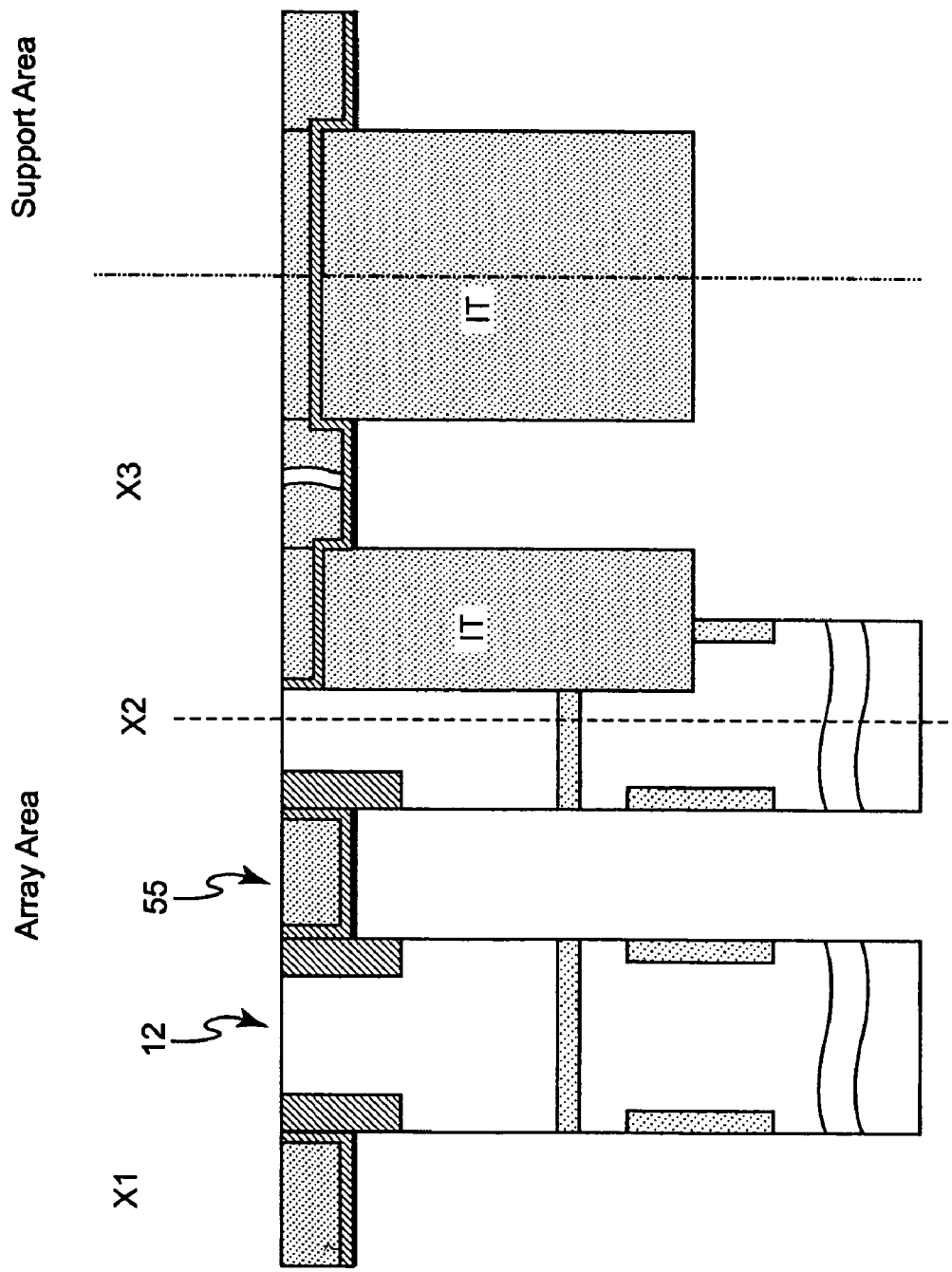

ARC materials, SOG, many resists and other materials such as commercially available Accuflow™ spin-on polymer available from Allied Signal, Inc. may be used for the process illustrated in FIG. 13. All that is necessary is that application of the material forms a planar surface, filling any existing topography, and that the material be etchable with a non-selective etch, preferably a reactive ion etch (RIE) at a rate near that of the materials above the intended end point of the etch or planarized surface to be formed so that etching from the planar surface of the material 130 will produce a planar surface when the etch is complete, as shown in FIG. 14A. That is, the goal is to etch all materials (ARC, oxide, nitride, polysilicon, etc.) that may be encountered during planarization at the same rate considering loading sensitivity. The non-selective RIE may not etch ARC, oxide and/or nitride at the same rate when only one of those materials is present. A reactive ion etch (RIE) is preferred using $CF_4$ in the absence of or with an amount (usually small) of oxygen and/or nitrogen to make the process non-selective. If excess oxygen and/or nitrogen is present, the process tends to become selective between the materials; etching the oxide at a slower rate than the organic material. As with CMP, the planarization process is carried out to and possibly slightly into the deep trench memory cell studs to remove oxide therefrom while leaving ATO in the active area between them and leaving the nitride liner in the support area intact. This process thus provides a planarized surface which is planar to a tolerance of or below 15 nm and without the possibility of scratching or chipping of structures such as memory cells 12 or isolation structures (IT).

Figure 14B:
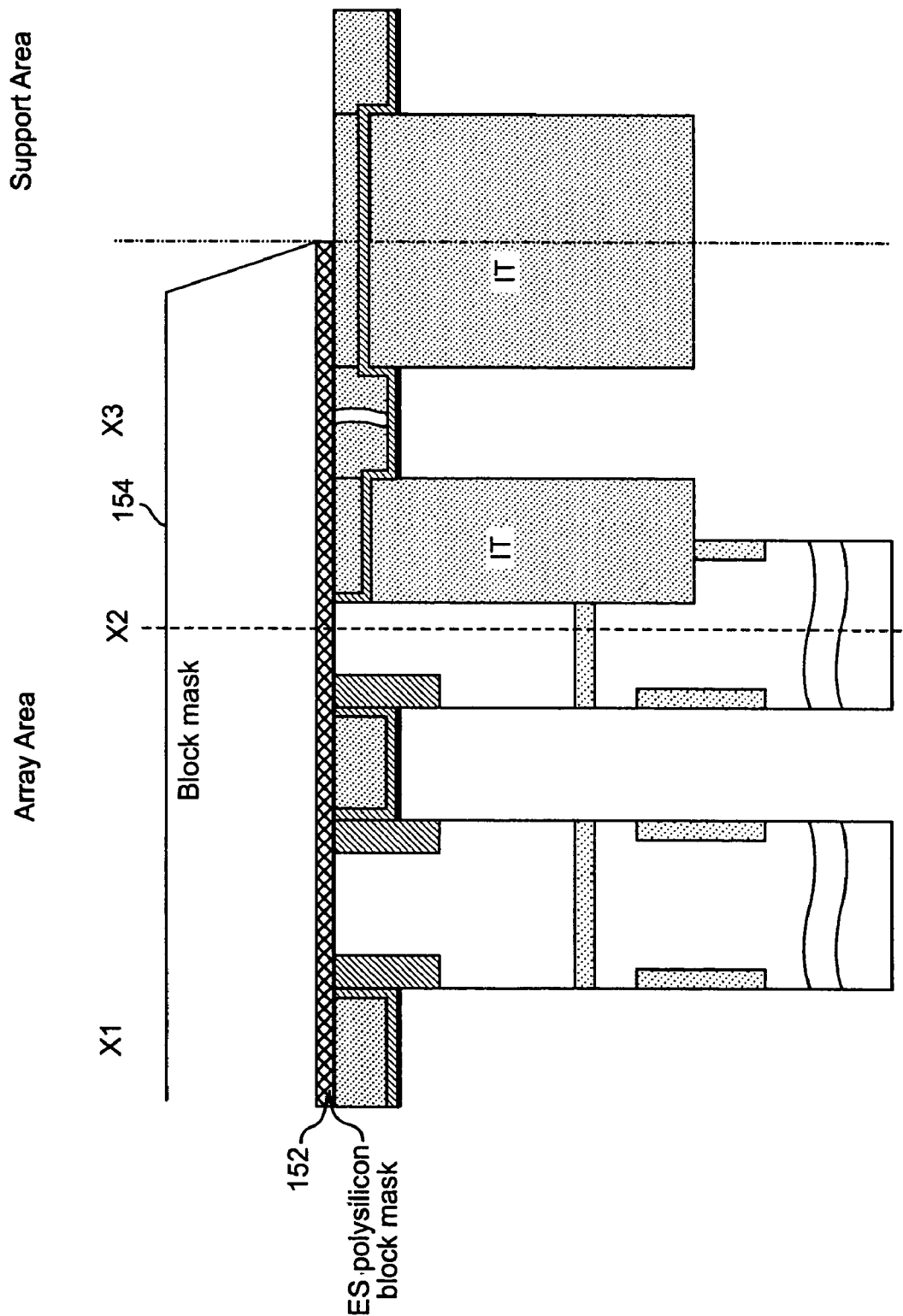

As shown in FIG. 14B, a polysilicon layer 152 is deposited and a block-out mask (sometimes referred to as an etch support (ES) mask) is applied and patterned. The patterning is then transferred to the polysilicon layer 152 to form a hard mask, after which remaining ATO in the support area is removed by etching using the support nitride liner as an etch stop, the nitride liner is removed, the pad oxide is removed, sacrificial oxide is grown, support dopant implants are done and gate oxide and gate polysilicon deposited and patterned in the support area. The integrated circuit can then be completed by word line and bit line formation and other BEOL processes similar to those of FIG. 9, discussed above and which will be evident to those skilled in the art.

The ARC-assisted planarization in accordance with the second embodiment of the invention is of general utility and can be applied to TOE and TOL processes as well as other processes which require or benefit from planarization as can the height reduction by deglazing described above in connection with the first and second embodiments of the invention. In the interest of completeness, the application to a TOL process of the ARC-assisted planarization of the second embodiment and the height difference reduction by deglazing in both support and array areas and etching of oxide in the support area only with a block mask covering the array of the first embodiment will now be described.

Figure 15A:
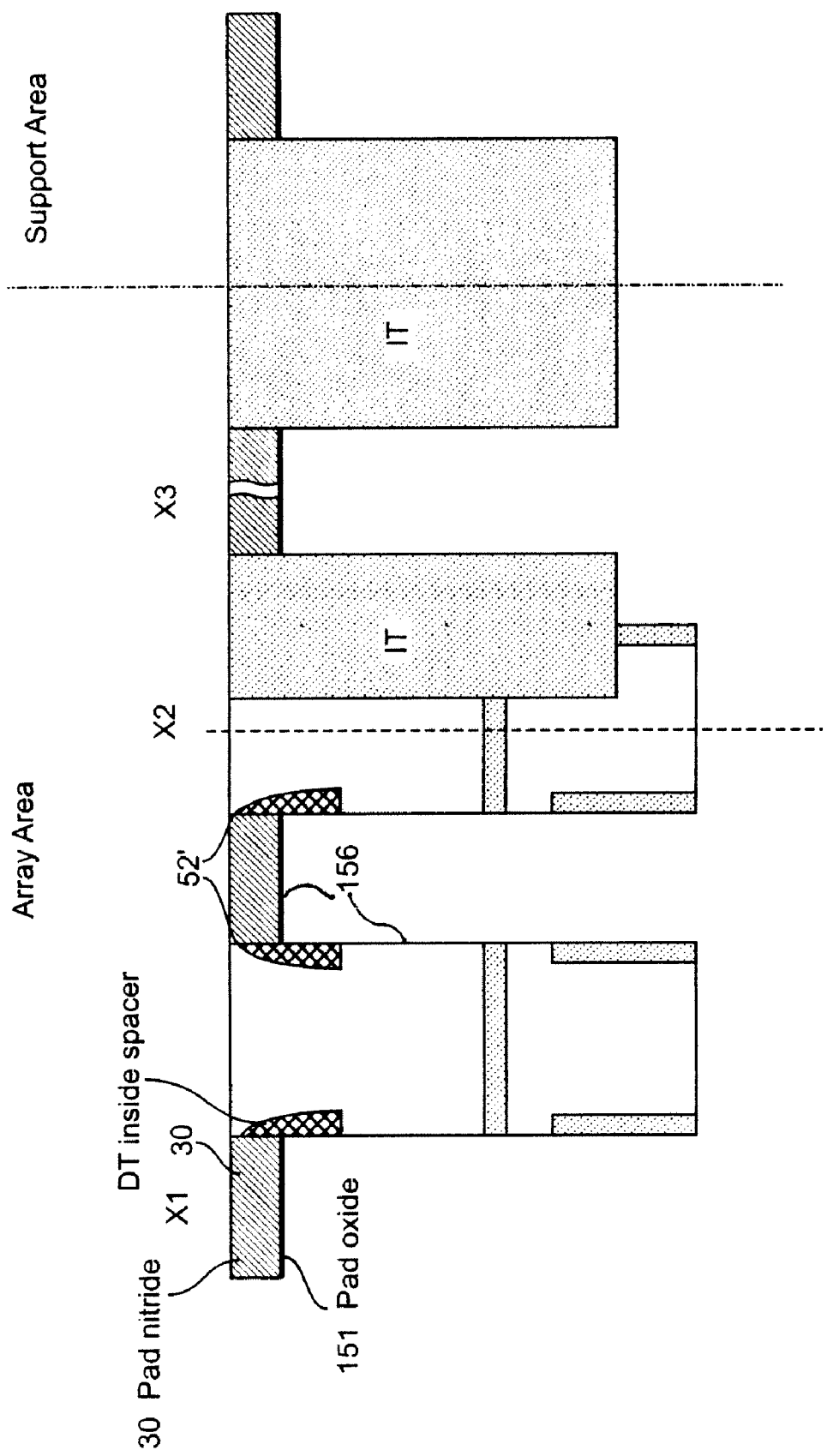
FIGS. 15A, 15B, 15C, 15D, 15E, 15F and 15G illustrate application of the second embodiment of the invention to a top oxide late (TOL) process.

FIG. 15A provides a cross-sectional view of an exemplary structure similar to that of FIG. 1. It should be noted, however, that spacers 52 are formed as deep trench (DT) inside spacers 52'. Additionally a pad oxide 151 and vertical array transistor gate oxide 156 (also present in the structures in the TOE and TON processes described above) are provided which also extends vertically between the pad nitride 30 and the inside spacer 52'. As with FIG. 1, FIG. 15A reflects an intermediate state of manufacture following formation of isolation structures and memory cells having vertical capacitors and transistors and planarization by CMP or ARC-assisted planarization.

Figure 15B:
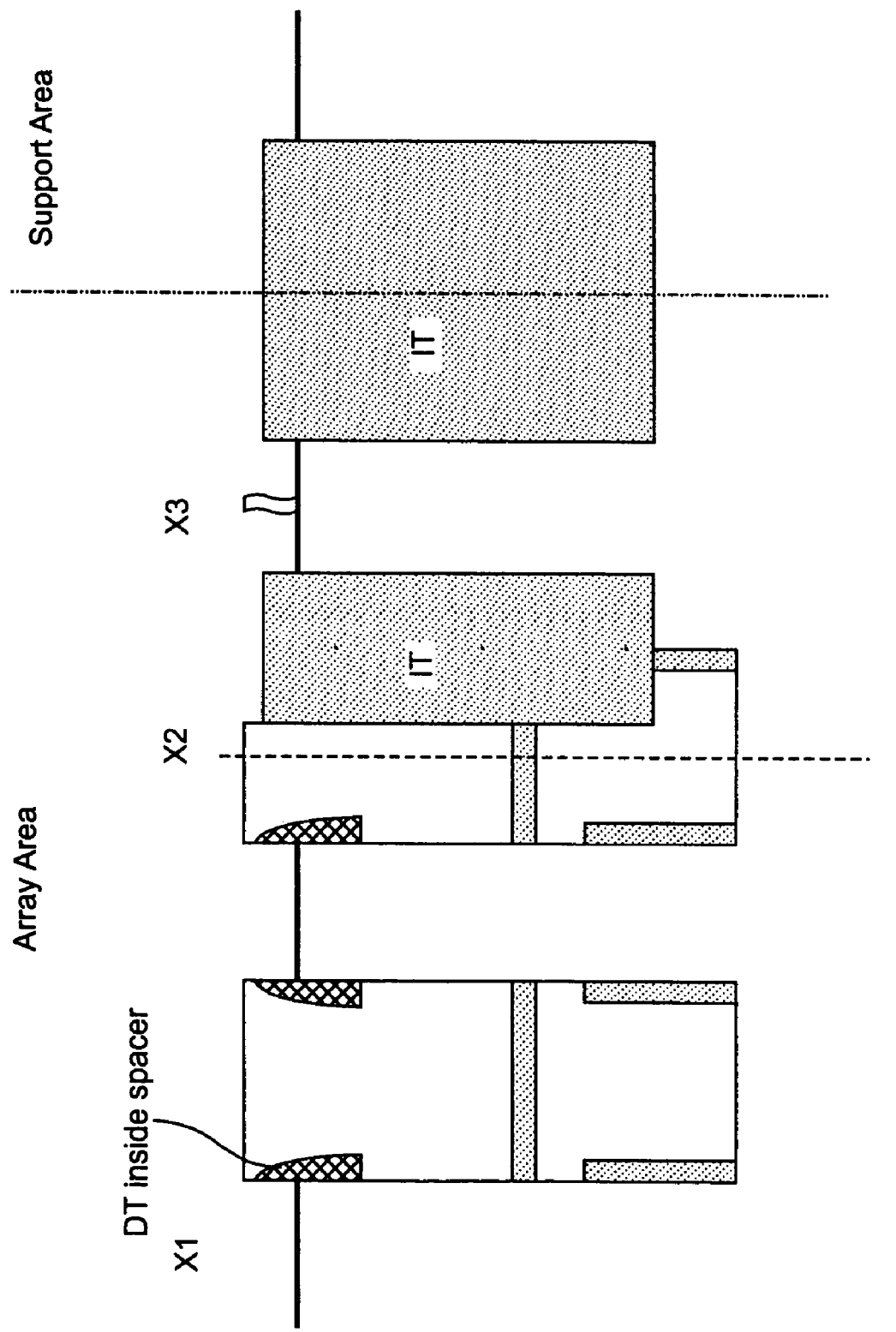

The structure of FIG. 15A is then deglazed as described above in both the array and support areas to reduce the height of the isolation structures. The pad nitride 30 is also stripped selectively to the inside spacers 52' in both the array and support areas such that the inside spacers 52' are conserved. The inside spacer is protected by the vertical array device gate oxide during the pad nitride etch. These processes result in the structure illustrated in FIG. 15B.

Figure 15C:
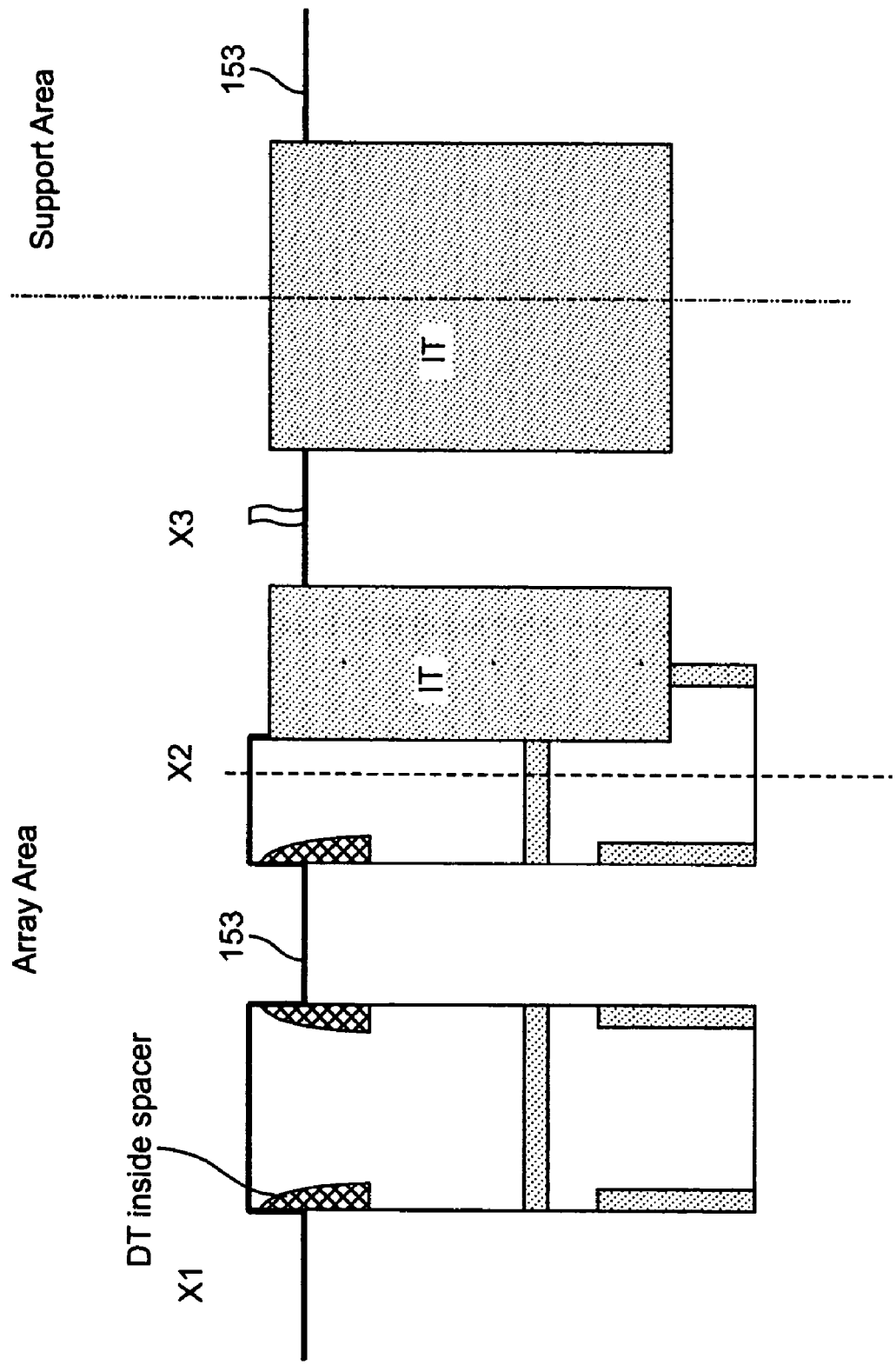
Figure 15D:
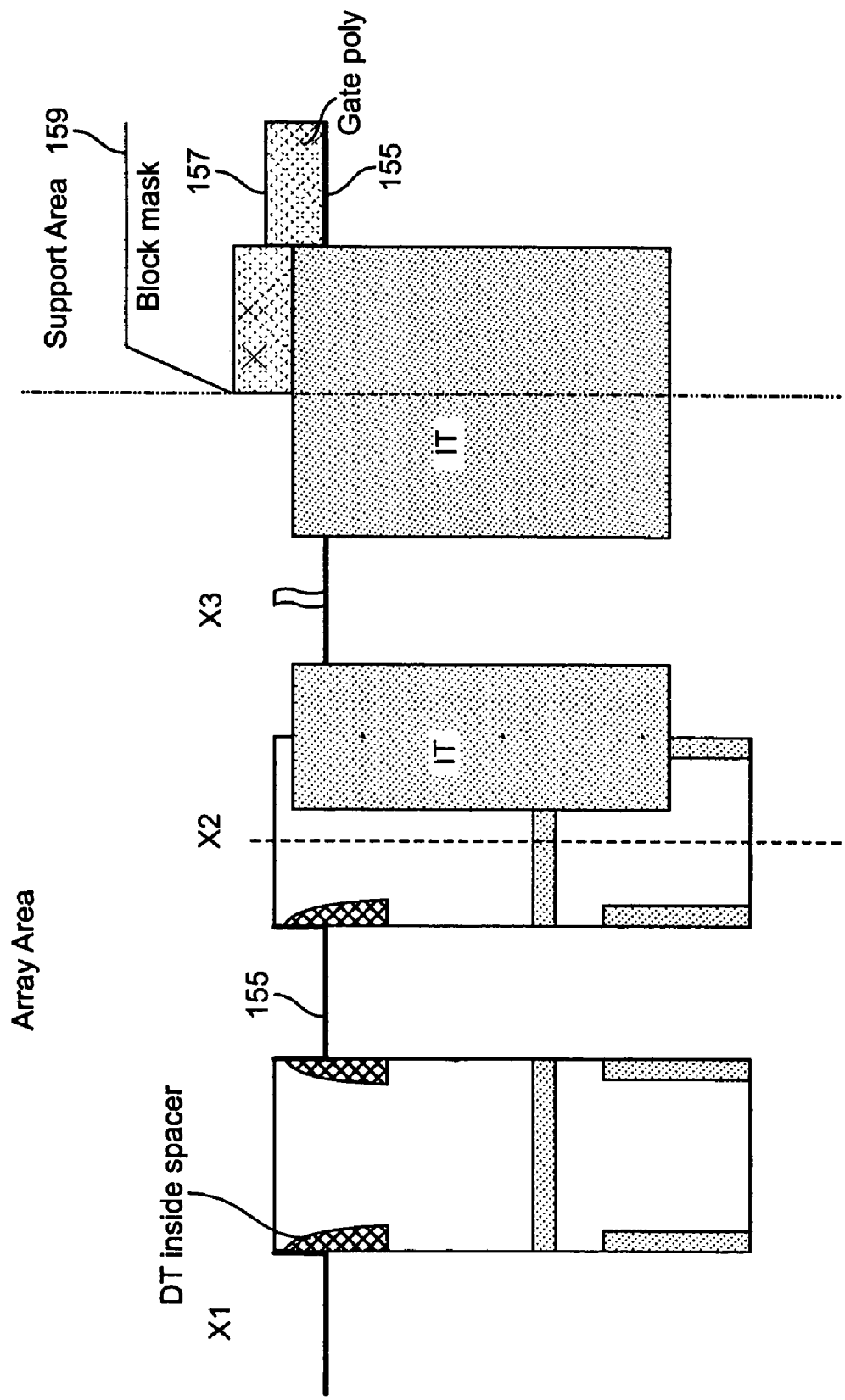

Then, as shown in FIG. 15C, the pad oxide 151 is stripped and a sacrificial oxide 153 is preferably grown in both the array and support areas. Impurity implantations are preferably performed at this point in both the array and support areas. Optionally, a nitride spacer deposition and RIE (not shown) can be performed at this point, as well, as will be understood by those skilled in the art. Gate oxidation 155 (FIG. 15D) in the array and support areas can then be performed followed by deposition of a gate polysilicon layer 157 in both the array and support areas. Thickness of the gate polysilicon layer 157 is preferably regulated in accordance with the intended thickness of the ATO to be applied and which will generally correspond to the original thickness of pad nitride 30. Providing a thickness of gate polysilicon substantially equal to the ATO thickness (which, it turn, is determined by the pad nitride 30 which is earlier removed and which space the ATO must fill) assists in optional height equalization which will be described below. A block mask 159 is then applied to the support area and the gate polysilicon 157 is removed from the array area, resulting in the structure shown on FIG. 15D. The resist/block mask 159 is then removed.

Figure 15E:
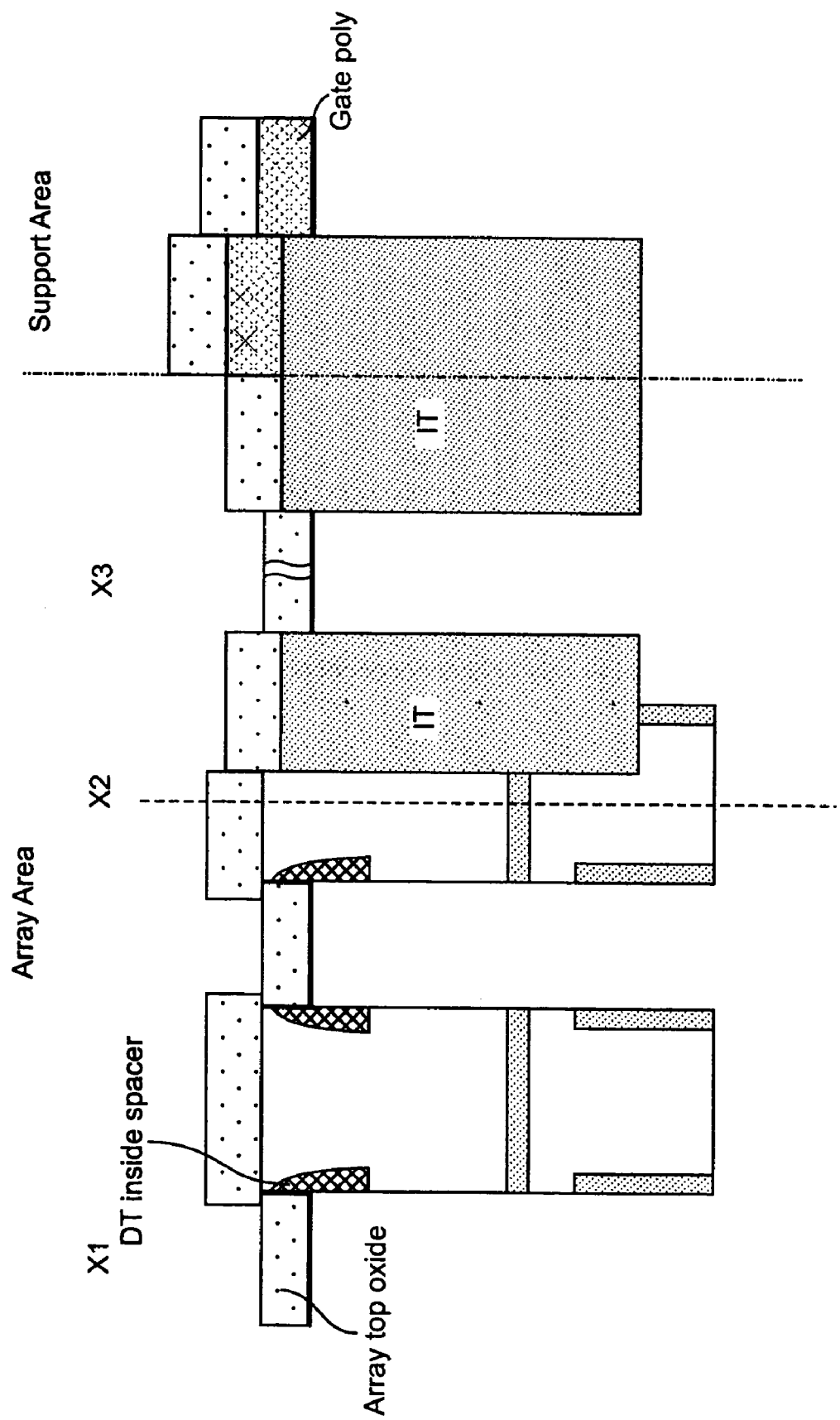
Figure 15F:
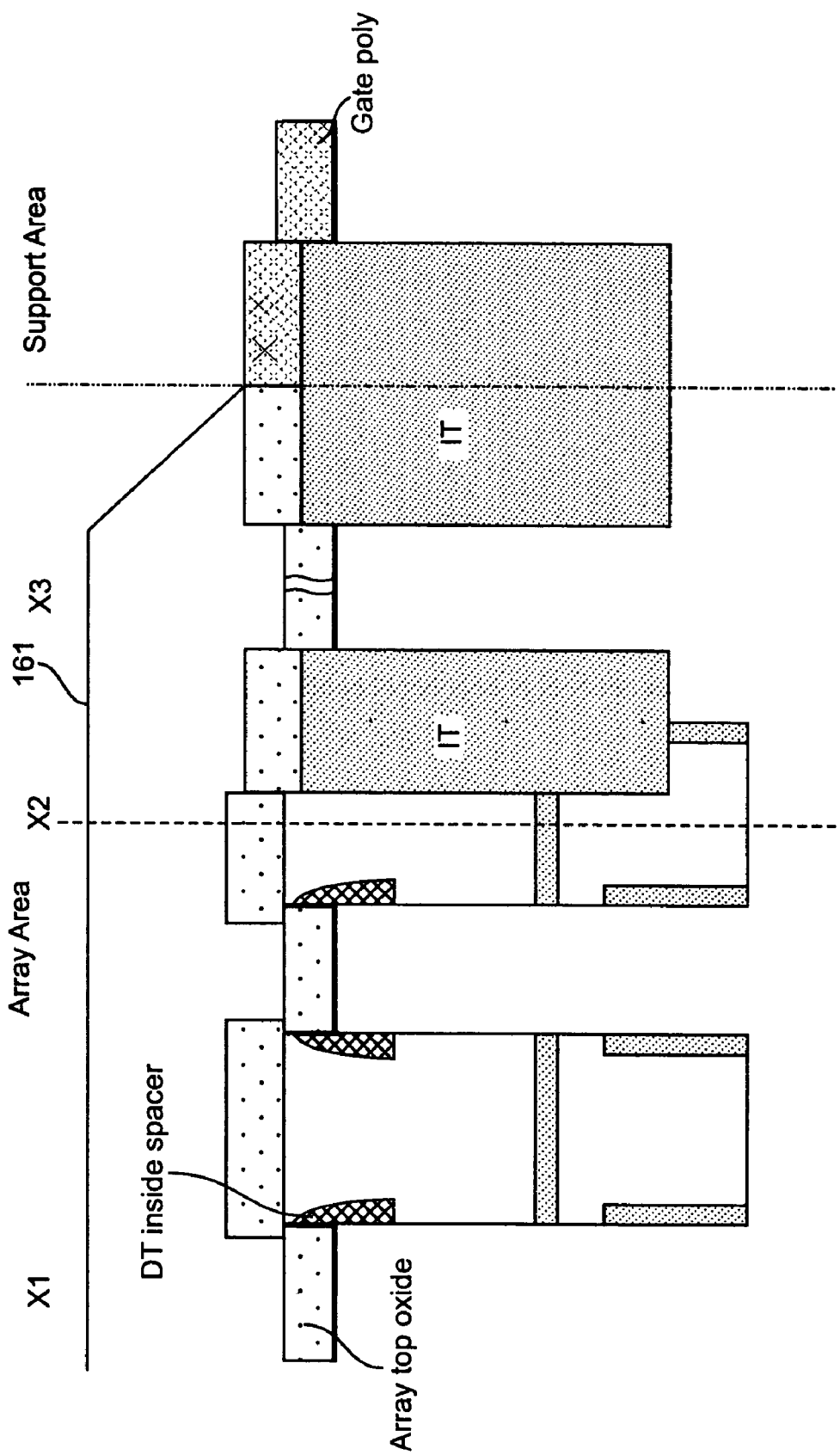
Figure 15G:
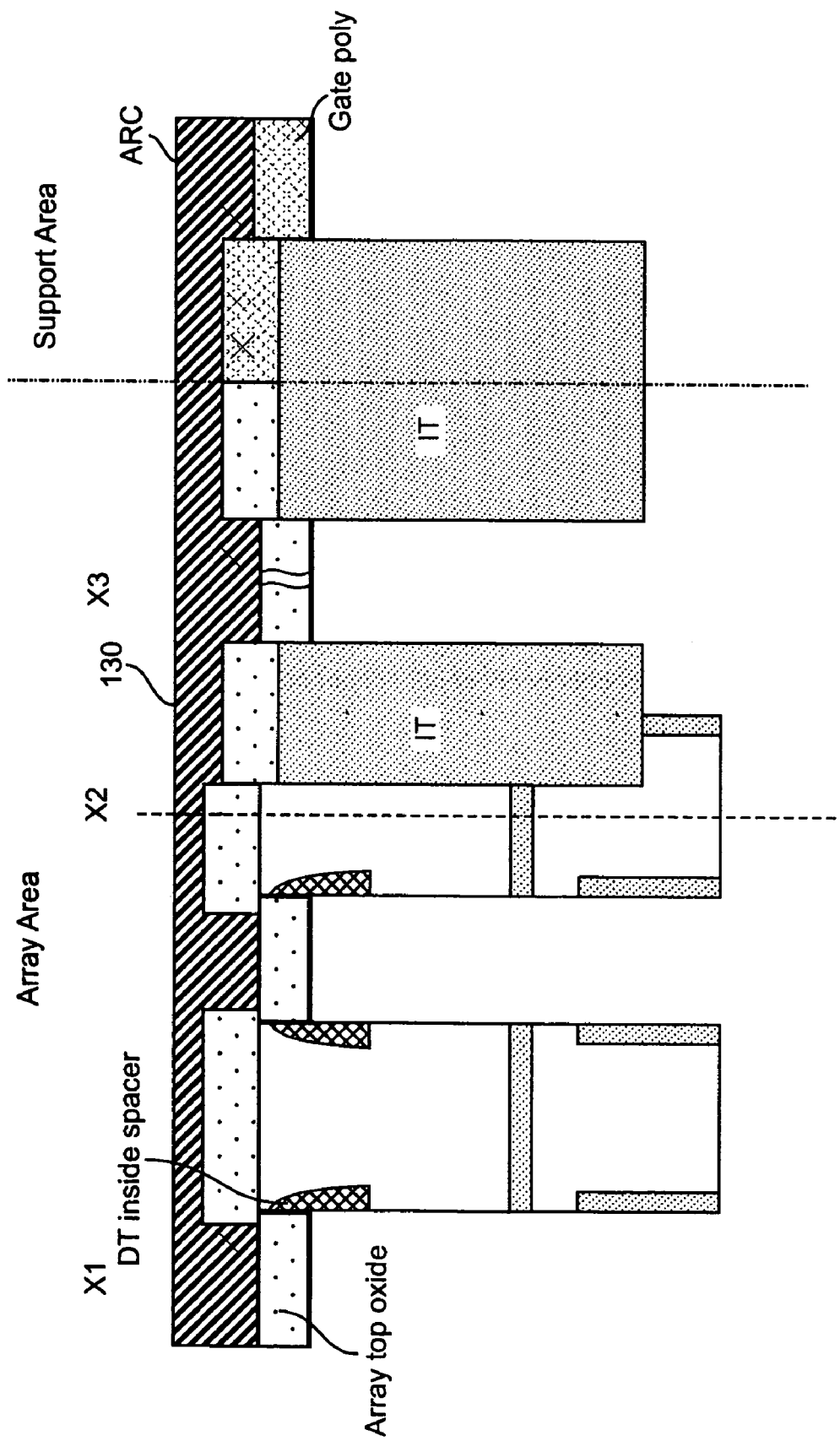

As shown in FIG. 15E a layer of array top oxide is then deposited on the array and support areas. (Since the ATO is applied after formation of the gate polysilicon in the support area the process is referred to as top oxide late (TOL).) This results in a step height difference between the array and support areas approximately (e.g. due to the deep trench memory cell devices in the array area) equal to the thickness of the gate polysilicon which is relatively small in comparison with TOE processes. Therefore, further height equalization, as shown in FIG. 15F is optional. If height equalization is performed, it is achieved by masking the array area with mask 161 and removing the ATO from the support area. This results in the topography of the array and support areas being of substantially equal height and step height, as shown in FIG. 15F. Then, as shown in FIG. 15G, ARC material is applied as described above and etching to or slightly into the surface of the memory cells 12 (preferably using end point detection) provides a planarized surface across both the array and support areas, as discussed above with reference to FIGS. 13 and 14A.

While the second embodiment of the invention, as discussed above, provides high manufacturing yield when used in connection with a TON process (which cannot otherwise produce comparable manufacturing yield due to poor planarization performance of CMP processes in regard to dishing and/or scratching or chipping) manufacturing yield of the second embodiment is not optimal when used with TOE and TOL processes such as the TOL process described above if the gate polysilicon layer thickness must differ significantly from the ATO/pad nitride thickness for a given design or the TOE process described in connection with the first embodiment of the invention, even though the first embodiment combined with ARC-assisted planarization provided a much improved yield compared with prior TOE processes.

In particular, when the first embodiment TOE process or prior known TOE processes are combined with ARC planarization, the nitride in the support area is not reached during etching and thus end point detection such as by optical spectroscopy or evolved gas analysis cannot be used to detect completion of the etching process. Moreover, when a known TOE process is combined with ARC planarization, it has been observed to suffer significant loss of manufacturing yield, principally from so-called picture-frame defects (where faults principally occur at the edges of the array areas) and foreign material (FM) faults (where deep etches cause undercuts of material such as polysilicon at the edges of the array areas which then forms unsupported filaments which may become dislodged and contaminate the structure). Additionally, TOE processes result in topographies of substantially different heights in the array and support areas which tends to compromise lithographic processes for forming connections within and between the array and support areas and have been unacceptably subject to picture frame defects and foreign material faults even though the step height in both the array and support areas is reduced significantly by the deglazing described above in connection with the first embodiment of the invention. The TOL process is subject to picture frame defects but not foreign material faults when it is combined with ARC planarization. In particular, memory cell connection defects have been found to occur predominantly at the borders of array areas 14 when the first embodiment TOE process is combined with ARC-assisted planarization (although a substantial improvement over prior known TOE processes is achieved thereby) and are thus known as picture frame defects. Additionally, in known TOE processes and the first embodiment with ARC-assisted planarization and TON processes, foreign material faults, believed to result from detached polysilicon filaments at the edges of the array areas produced by material undercutting during extended etching processes have been observed, as alluded to above.

Referring back to FIG. 5, it should be noted that the height of the ATO above the active or diffusion areas 55 between the memory cells 12 approximates the height of the original semiconductor chip surface due to removal of the pad nitride 30 in the array area while the ATO height at locations above the memory cells is substantially greater (e.g. by addition of the nominally 75 nm thickness of the ATO) and the ATO above the isolation structures 32 is only slightly less in the array area by an amount corresponding to the recessing performed in the deglazing step described above in connection with FIG. 3 while the height of the ATO in the support area is greater, even where recessed by the deglazing step due to the presence of the oxide hard mask, support nitride liner and pad nitride.

The inventors have discovered that the increased height of structures in the support area as compared to the height of structures in the array area compromises the removal of ATO over the memory cell 12 studs by planarization using CMP, even with additional processes and also compromises the control over the planarization process and other lithographic processes to form connections to the memory cells 12. Even when the ARC-assisted planarization of the second embodiment is used in combination with a TOE process (e.g. a known process or that of the first embodiment of the invention), the difference in structure height between the array and support areas impedes the planarization of the applied ARC, SOG, resist and the like planarizing materials, resulting in a slightly increased thickness thereof at the borders of the array area. Planarizing ARC, resist and the like can planarize local height variations less than several hundred nanometers but cannot planarize global variations significantly larger than microns. Accordingly, planarization to the surface of the memory cell 12 studs at the borders of the array area is compromised. Further, the differences in overall height of the surface of the planarization material in such circumstances prevents the desired 15 nm planarization tolerance from being achieved either through CMP or ARC-assisted planarization.

That is, the inventors have recognized that picture frame defects are largely due to insufficient planarity and uniformity in thickness of resists, anti-reflective coating materials, spin-on glass and the like which make planarizing materials and oxide on top of studs difficult to remove without extended etching processes while extended etching processes will compromise array top oxide in the center of the array where ATO thickness greater than about 30 nm are required while polishing processes also do not yield sufficient planarity to support good yield during word line/bit line/BEOL processes including conductor array formation and are an additional source of defects due to difficulty in avoiding damage to structures already formed. In other words, the inventors have recognized that ATO formation processes and planarization of ATO, in particular, cause a plurality of trade-offs between types of defects; each of which reduces manufacturing yield.

Accordingly, the third embodiment of the invention simultaneously avoids the engendering of defects of the picture frame and foreign material contamination types since deep etches are avoided while reliably removing planarization materials and avoiding damage to structures while achieving improved uniformity of planarity within a tolerance of under 15 nm in order to support high lithographic resolution for connection formation, bit line contact formation and other BEOL processes and which are particularly critical in the preferred environment of chips having both array and support areas, such as large capacity memories and logic processors having embedded memories.

The third embodiment of the invention features not only increased control over height of structures in the array and support areas by deglazing as discussed above in connection with FIG. 3 but adjusting the average height/step height of the structures to be substantially the same so that planarizing materials can adequately fill regions between higher areas and achieve good planarization of the surface of the planarizing material. As can be observed from FIG. 5, the average height of the ATO surface in the array area can be readily determined to an accuracy adequate to the successful practice of the third embodiment of the invention from the areas of the storage cells and the isolation trenches, the thickness of the ATO (which is readily controllable) and the recess of the deglazing process. Similarly, the average height of the ATO surface in the support area can be determined from the area of isolation structures, the recess of the deglazing process and the readily controllable thicknesses of the oxide hard mask 36, the support nitride liner 34 (if used), the ATO 56 and pad nitride. (The optional array nitride liner 54 is deposited for both the array and support areas and, for height calculations, may be omitted for convenience.) Thus, the average ATO height/step height can be reduced in the support area to substantially match the (lower) ATO height/step height in the array area. It should be noted in this regard, that, depending on the particular integrated circuit element design in the respective differentiated regions of the chip, the same problem may occur near the boundary of the differentiated areas and the higher average height/step height can be reduced to approximately match the lower in accordance within the planarizing capacity of the planarizing material to fill lower height regions in accordance with the third embodiment of the invention regardless of the integrated circuit design or fabrication processing. Especially when a TOL process is combined with ARC-assisted planarization, the support step height is significantly higher since gate polysilicon conductor exists in the support area only. The third embodiment using a block mask and etching the ATO in the support area can be readily applied to the TOL process and can improve yields significantly.

Figure 16:
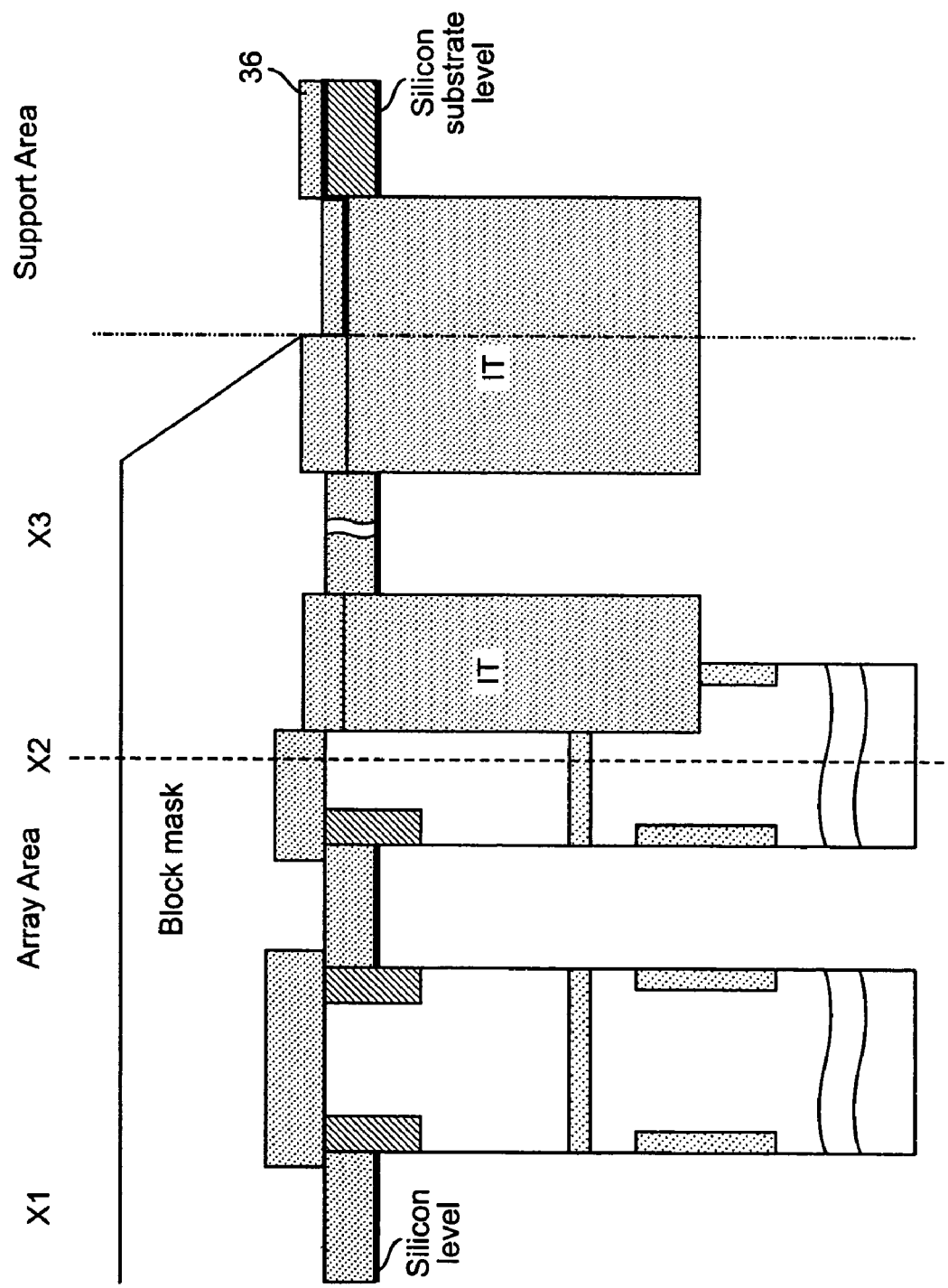
FIGS. 16 and 17 are cross-sectional views of initial stages of semiconductor integrated circuit fabrication in accordance with a third embodiment of the invention, particularly in regard to employing the planarization technique of the second embodiment of the invention to a TOE process such as in the first embodiment of the invention.

Referring now to FIG. 16, a block-out mask is now applied to the array area and the support area is etched through the ATO 56, the optional array nitride liner 54, if applied, and into the oxide hard mask 36 to a distance such that the average height in the support area approximates the average height of the ATO in the array area. It should be noted that the average height of the oxide hard mask above the original chip surface is the same as its thickness plus the thickness of the pad nitride except above isolation structures where the height will be reduced by the amount of deglazing. The etching (either RIE or wet etching) of the oxide hard mask will reduce the thickness of the oxide hard mask equally, whether in a recessed area or not. Therefore, the average height of the oxide hard mask in the support area can be readily determined from the thickness of the oxide hard mask, the area of the isolation structures, height of the pad nitride, support nitride liner (if used) thickness and the depth of the recess formed by deglazing as noted above. This average height will be uniformly reduced as etching of the oxide hard mask progresses. If an array nitride liner is used, the array nitride liner can be etched depending on the height difference between the array and support. In this regard, the oxide hard mask and the ATO may be of the same quality or different qualities and even if oxide of the same quality is used for both, as deposited, the quality of the oxide in the ATO oxide hard mask may be changed due to annealing, oxidation, implants or the like and the interface between the ATO and the oxide hard mask can be detected. In any case, the qualities of the ATO and the hard mask are known. As a practical matter, the average height of the surface of the hard mask in the support area will often closely approximate the average height of the ATO in the array area and the hard mask is not etched or only partially etched in the support area to make the average height or average height/step height substantially equal in the array and support areas. (The term "step height" refers to the height above the silicon substrate level and is determined by the IT height above silicon, pad nitride thickness, nitride liner thickness, the remaining oxide hard mask thickness and stud height in the array.)

Figure 17:
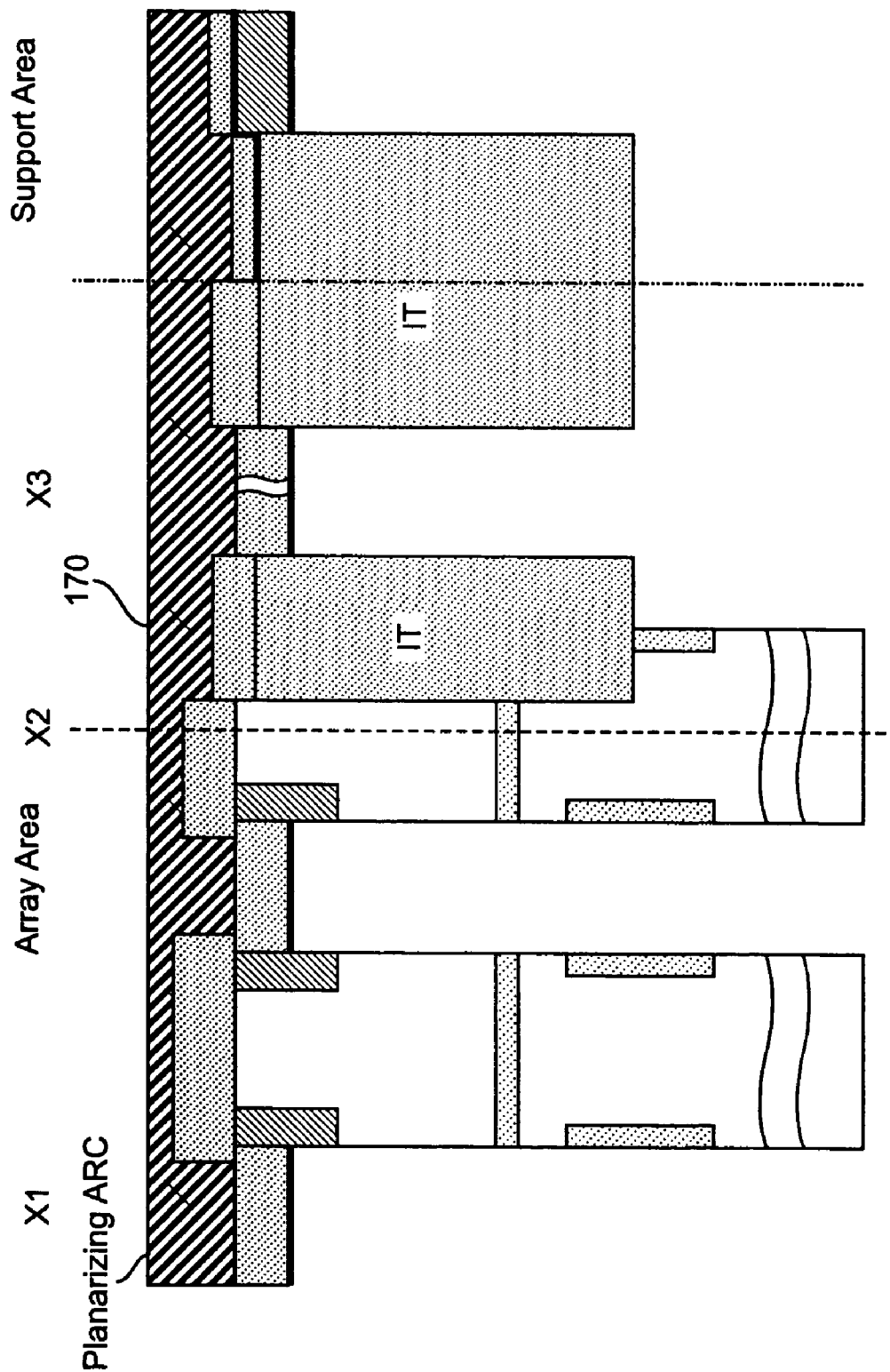
Figure 18:
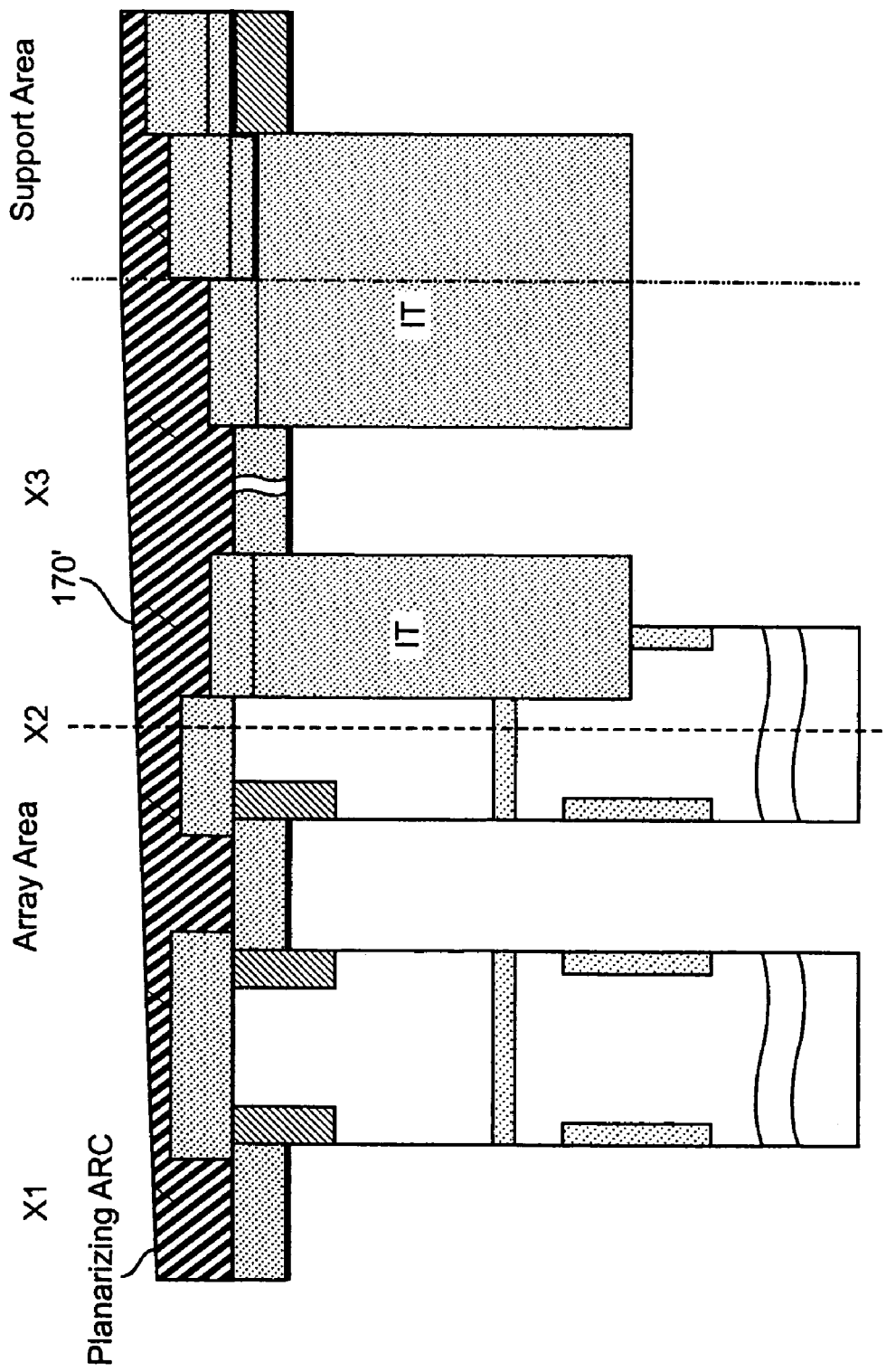
FIG. 18 is a cross-sectional view of a chip illustrating the effect caused without the third embodiment of the invention for comparison with FIG. 17, and FIGS. 19, 20, 21 and 22 are cross-sectional views illustrating completion of an integrated circuit structure in accordance with the third embodiment of the invention.

Then, as shown in FIG. 17, a planarizing layer 170 of, for example, anti-reflective coating material is applied and forms a substantially planar surface covering the chip/wafer. The high degree of planarity of this coating is due to the substantial equalization of average height of structures in the support area as discussed above in connection with FIG. 16. For comparison, the result without such height reduction is illustrated in FIG. 18 in which it can be seen that the thickness of the planarizing coating 170' increases in thickness toward the transition between the array area and the support area having greater average height. This difference in thickness presents severe difficulties in both planarization and completeness of removal of the ATO above memory cell 12 studs in the region where increased thickness occurs and compromises the formation of connections to memory cells or other structures at the periphery of the array area; directly resulting in picture frame defects discussed above. If additional etching is employed to remove the coating, structures in the array area may be damaged and the array top oxide in the center of the array is compromised (e.g. made too thin or removed altogether in some locations) as well as compromising the result of any planarization process. Usually, ATO thicknesses greater than 30 nm are required for isolation of passing word lines from active areas. The difference in thickness may also compromise the degree of planarity which may be achieved through CMP.

Figure 19:
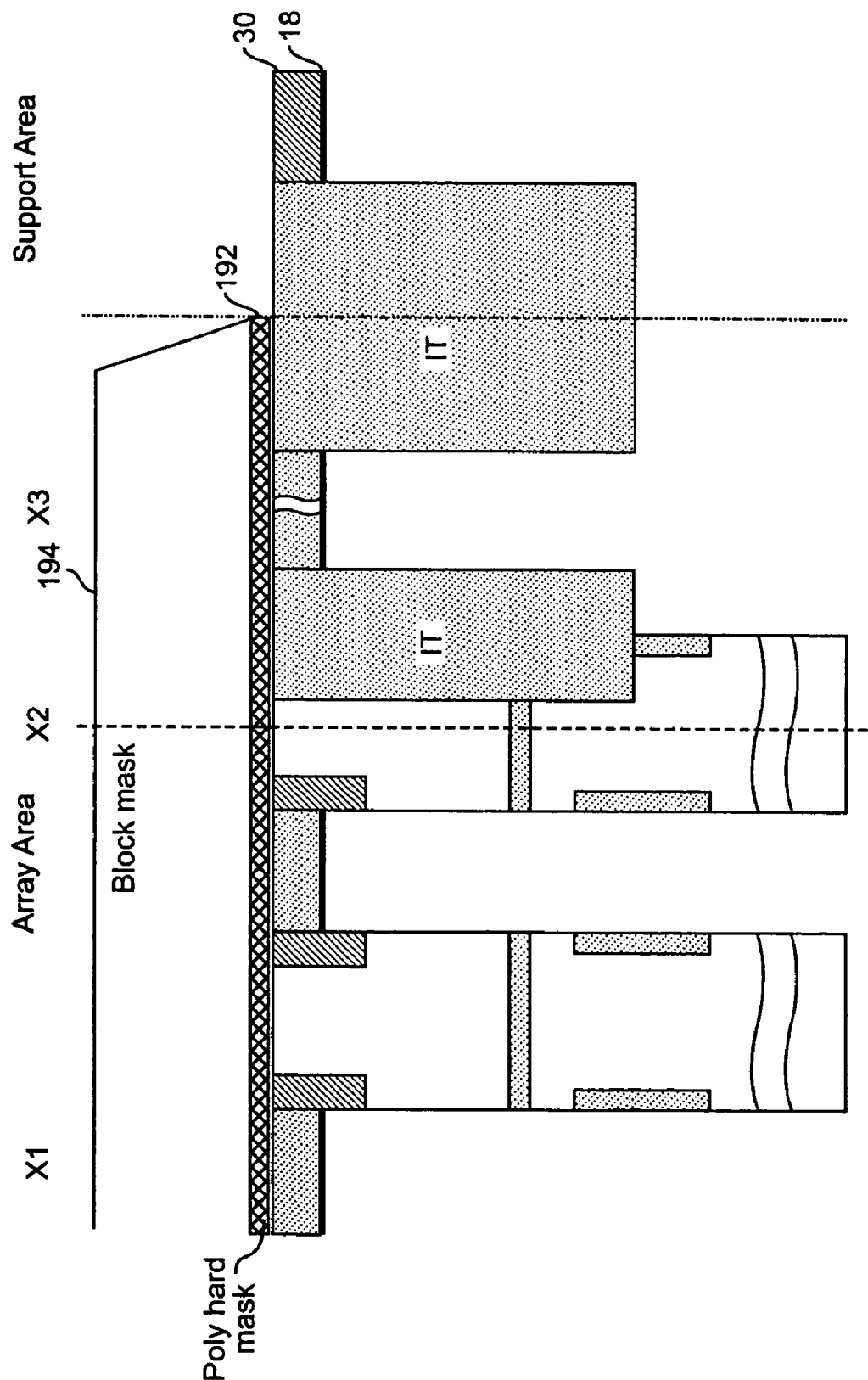

After applying the planarization coating as shown in FIG. 17, a non-selective etching process is carried out slightly beyond the original wafer surface, preferably to about 50 nm above the silicon surface (e.g. where pad oxide 18 is formed or about twice the preferred minimum thickness of ATO); resulting in the structure illustrated in FIG. 19. The etching of ARC, oxide and nitride will be done uniformly in the array and support areas and the etch rate can be readily determined from end point detection (EPD) at the interface of the oxide hard mask and the pad nitride. The end point can be determined by monitoring the CN (carbon nitride) signal of 386.5 nm wavelength. When the etching reaches the interface of the oxide hard mask and the pad nitride, the CN signal increases strongly and then leads to a plateau. Thus the determination of the rate of etching of ARC, oxide and nitride etching can be determined using EPD with sufficient accuracy for the successful practice of the invention. Numerous other EPD techniques such as optical spectroscopy, or reactant gas analysis are known and are also suitable for practice of the invention. During the non-selective RIE, the remaining oxide hard mask is completely etched and the support nitride liner and pad nitride is partially etched (about 50 nm) after etching the oxide hard mask in the support area or, in effect, the etching process may be terminated upon completion of the removal of the ATO on top of the studs in the array, leaving a flat surface in the array and support areas.

It is only necessary that the etching proceeds at approximately the same rate in the materials which will be presented. In this particular example, oxide, nitride (e.g. at the upper edge of the spacers 38 and pad nitride) and the ARC material should be etched at approximately the same rate although other materials may be presented by other structures to which the invention is equally applicable. It is only necessary that the etch rates for the various materials relative to the overall thickness of material to be removed be adequately similar to meet the planarity tolerance required (e.g. 15 nm, alluded to above). The basic principle of this process is that of starting with a highly planar surface of planarizing material 70 and etching all materials at the same rate, preferably with a reactive ion etch (RIE), preferably with $CF_4$ in the absence of or with oxygen and/or nitrogen to make the process non-selective, from that surface so that the exposed surface remains planar throughout the process and when the process is terminated. (However, the preferred RIE may not etch ARC, nitride or oxide at the same rate when only one of those materials is present and the loading sensitivity should be taken into account.) Therefore, this process, referred to as ARC-assisted planarization or ARC-assisted RIE (or, simply, ARC RIE), can be substituted for planarization processes based upon polishing such as CMP in order to avoid mechanical damage such as scratching incident thereto.

Then, as further shown in FIG. 19, a hard mask 192, preferably of polysilicon, is applied and patterned with a blockout mask resist 194 to expose the support area. The resist 194 may then be stripped.

Figure 20:
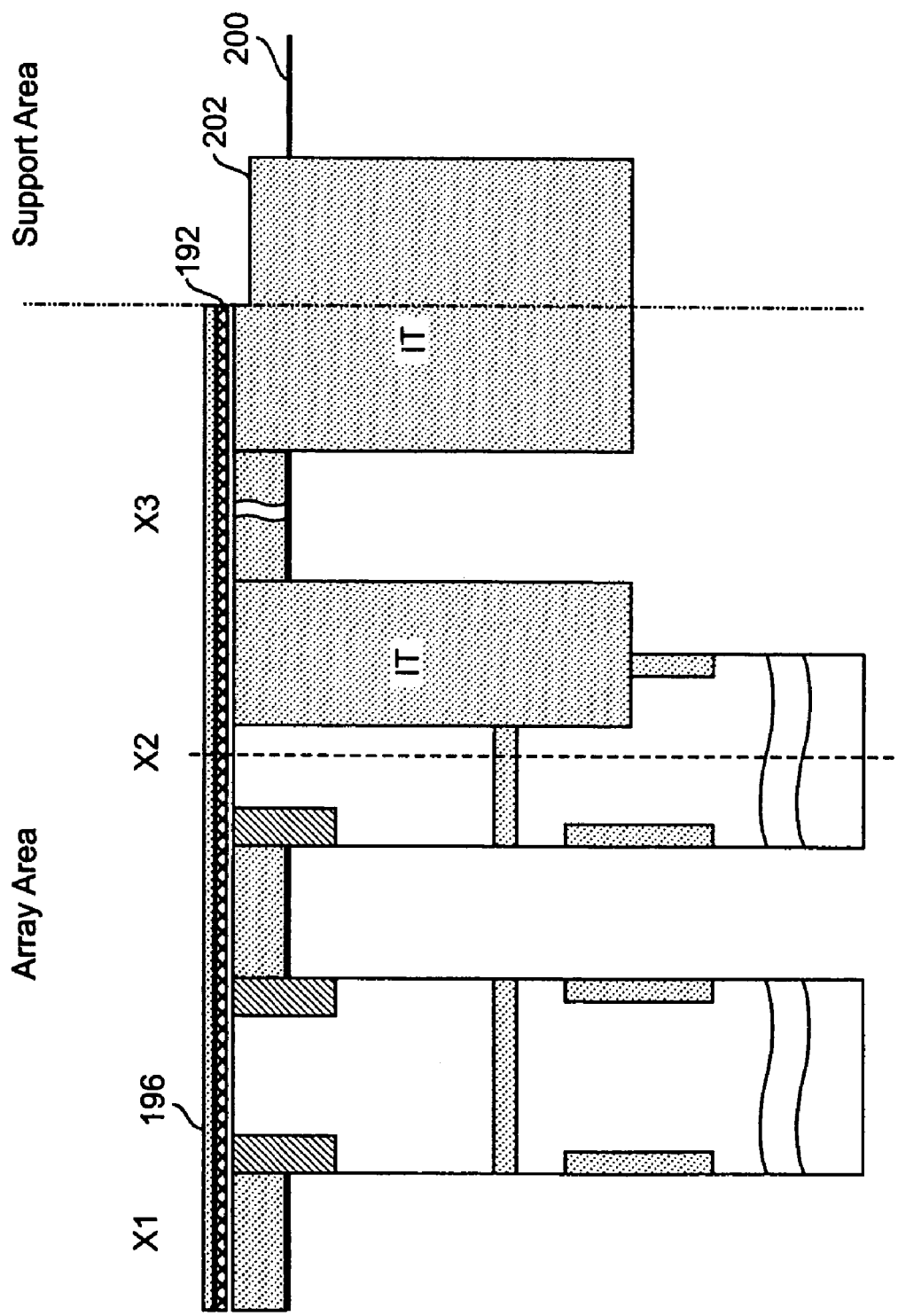

Following removal of resist 194, the exposed oxide and nitride liner (if not etched during the ARC RIE) are etched selectively to polysilicon. The IT oxide can be etched to a desired height, as well, as shown in FIG. 20. The IT oxide can be etched to a desired height 202 by an additional wet etching before etching the pad nitride. If, during the ARC RIE process, the IT oxide reaches a desired height 202, no further process is necessary. Since the third embodiment of the invention involves only minimal wet etching processes in the support area before gate conductor formation, foreign material defects such as polysilicon filaments in the transition region are significantly reduced. However, before removal of the nitride layer, it is common to do a small deglazing oxide etch since a thin layer of oxide may exist on nitride surfaces in many cases. The pad nitride 30 and pad oxide 18 are then stripped and sacrificial oxide 200 is then grown on exposed silicon, support implant processes performed and the sacrificial oxide removed and replaced with grown or deposited high-quality oxide which will form the gate insulators of support transistors or other devices in the support area, as shown in FIG. 20. These processes also result in the growth of oxide 196 on the surface of polysilicon hard mask 192.

Figure 21:
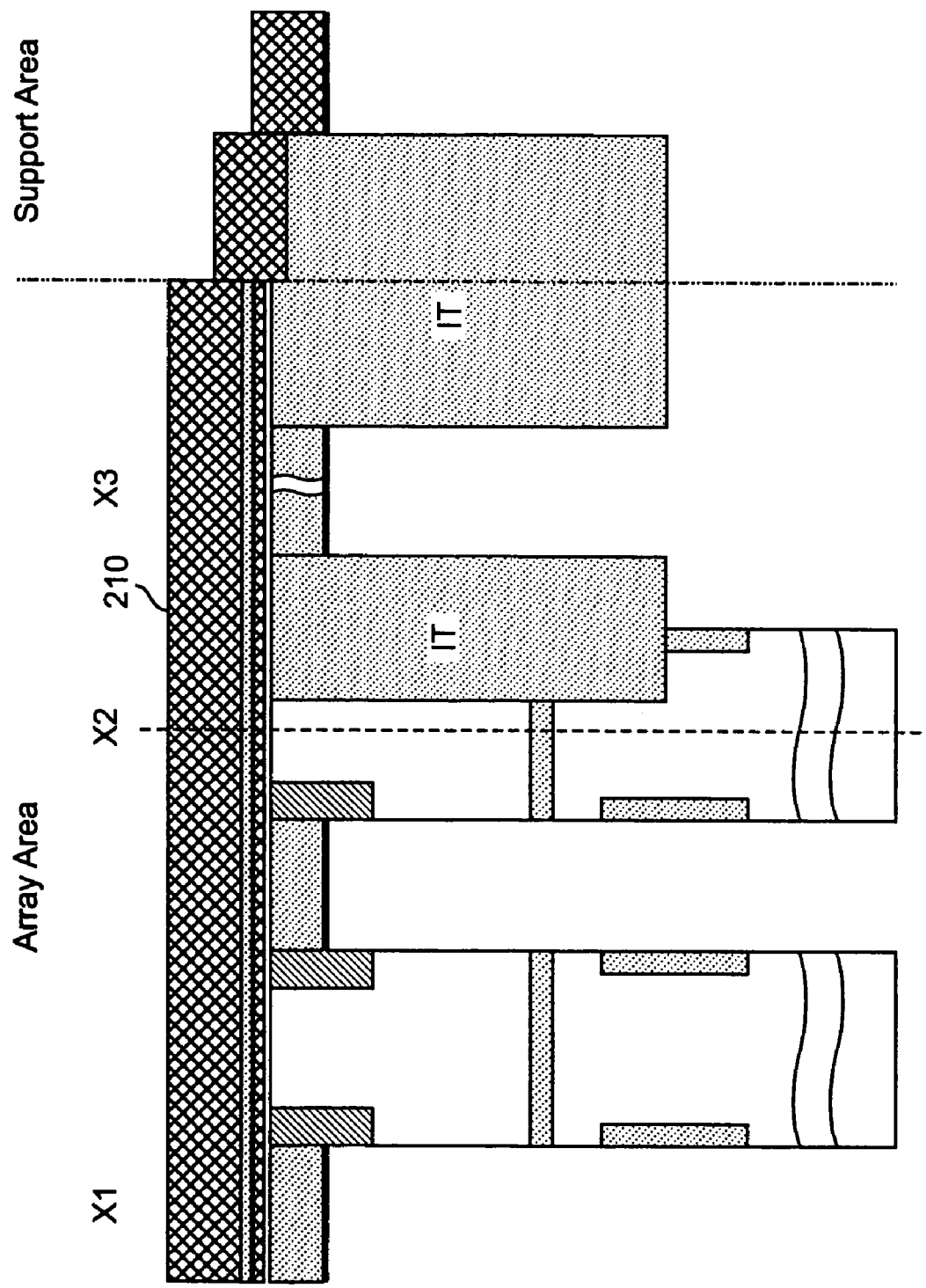
Figure 22:
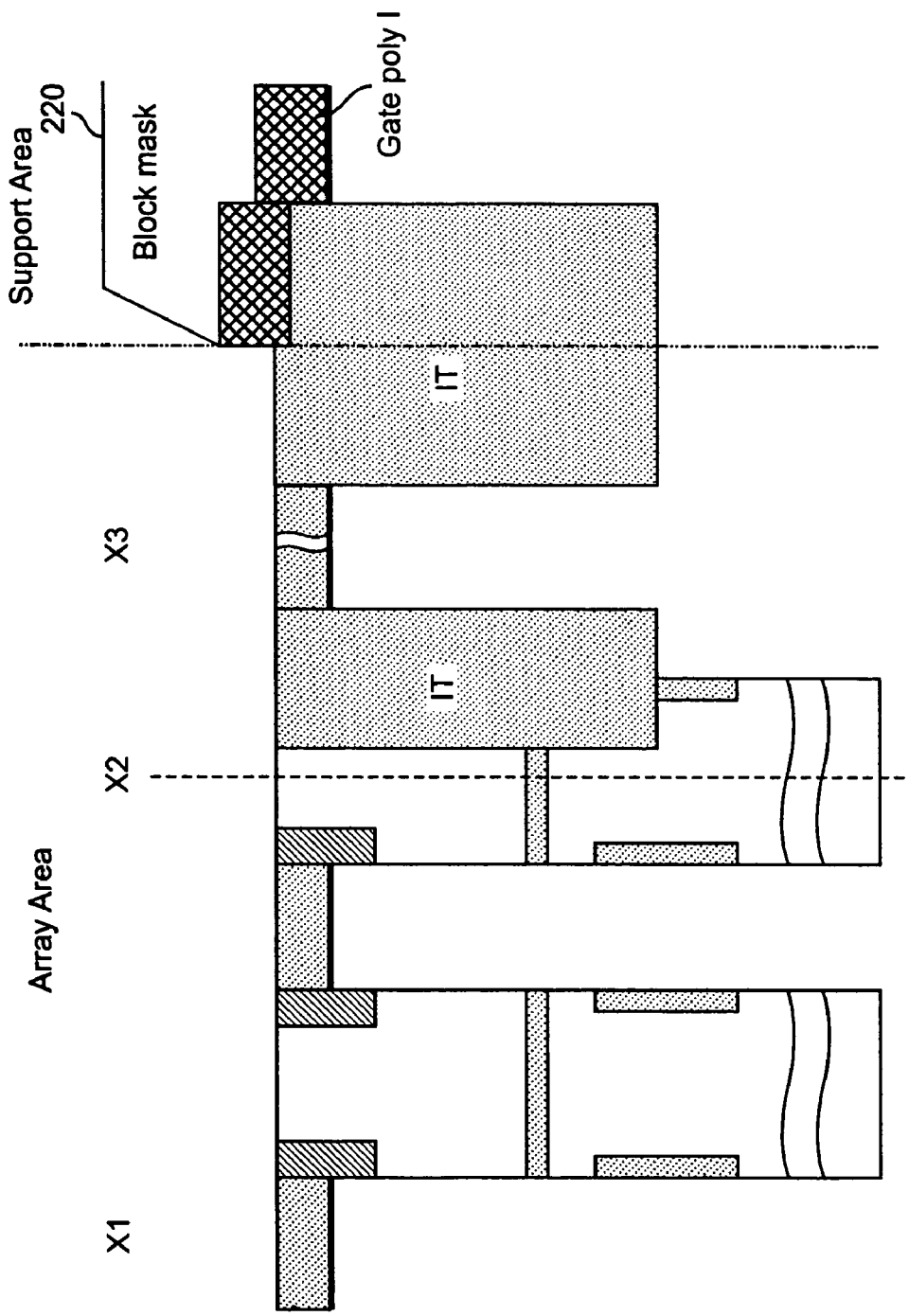

Referring now to FIG. 21, a layer 210 of polysilicon is deposited which will form the gates of transistors in the support area of the chip. Then, as shown in FIG. 22, resist 220 is applied and patterned to again expose the array area and the polysilicon layer 210, oxide 196 and polysilicon 192 are etched away from the array area exposing the highly planar surface formed as discussed above in connection with FIGS. 17 and 19. The integrated circuit can then be completed by patterning of the remaining gate polysilicon 210, word line and bit line formation and other BEOL processes as may be required by a given design. The array area is highly planar to support high resolution lithographic processes for producing word lines and bit lines at a fine pitch and, moreover, planarizing material is reliably and fully removed to avoid picture frame defects while deep or extended etches are avoided to eliminate compromise of manufacturing yield by foreign material. Further, planarization to a close tolerance (e.g. under 15 nm) has been achieved without polishing and possible attendant mechanical damage such as scratching. Therefore, it is seen that the invention, in providing an alternative planarization process of general applicability also avoids most major sources of compromise of manufacturing yield as well as the otherwise unavoidable trade-offs therebetween in regard to integrated circuits having plural respective areas requiring differentiated processing.

In view of the foregoing, it is seen that the invention provides, in the first embodiment thereof, improvements in known TOE processes by providing height control and reduced severity of topography and average heights of respective differentiated integrated circuit areas by deglazing and an array nitride liner below the array top oxide for filling defects in the nitride spacers and isolation trenches and for increased protection of underlying structures as well as an array and support polysilicon hard mask for improved process simplification and control. These features may be used to produce these meritorious effects with and of TOE, TON and TOL processes as well as numerous other processes for fabrication of other type of devices having differentiated functional areas requiring different device and structure designs in respective areas. Planarization of the ATO or similar layers over such different structures can be performed by CMP or the ARC-assisted planarization of the second embodiment of the invention.

In the second embodiment, the invention provides an alternative planarization process to known CMP processes which is of general utility but which avoids the possibility of mechanical damage to previously formed structures and provides improved planarity to a tolerance of less than 15 nm in applications where CMP processes may be inadequate to do so, particularly in regard to TON processes in which planarization results using CMP has been particularly poor.

In the third embodiment of the invention, the principles of ARC-assisted planarization are extended to circumstances of severe topography and large average height/step height difference between differentiated areas on an integrated circuit chip to achieve higher planarization tolerances and freedom from picture frame and foreign material contamination faults, especially due to formation of polysilicon filaments, particularly when TOE processes are employed while providing the additional advantages of removal of ATO above the memory cell 12 studs in the array area and etching of isolation trench structures in the support area at the same time; avoiding a further etch of isolation structures. The third embodiment of the invention which includes the option of removing or maintaining the support nitride liner during the ARC-assisted planarization RIE. These features of the invention which have been described in the environment of their preferred use and greatest potential advantage may be used singly or in various combinations to provide improved integrated circuit structures at enhanced manufacturing yields.

While the invention has been described in terms of a single preferred embodiment, those skilled in the art will recognize that the invention can be practiced with modification within the spirit and scope of the appended claims.

The invention claimed is:

1. A method for planarizing a surface of a body of material, said method including steps of
   applying a planarizing material to said body of material to form a substantially planar surface, and
   performing a non-selective etching from said substantially planar surface to a point on or within said body of material, in combination with a top oxide nitride process for forming an integrated circuit.

2. A method for planarizing a surface of a body of material, said method including steps of
   applying a planarizing material to said body of material to form a substantially planar surface, and
   performing a non-selective etching from said substantially planar surface to a point on or within said body of material, in combination with a top oxide late process for forming an integrated circuit.

3. A method for manufacture of an integrated circuit having structures formed in respective first and second areas thereon, said method comprising steps of
   reducing height of structures in said first and second areas to control step height in said first and second areas,
   removing a material from said first and second areas simultaneously or sequentially, and replacing said material removed from said first and second areas with a first material in said first area and a second material in said second area, respectively, one of said first and second materials being an isolation material,
   using a polysilicon block-out mask or a block-out mask having two layers of different materials to protect one of said first and second areas to separately process the other of said first and second areas,
   planarizing said first and second materials to provide a planar surface,
   equalizing heights of structures in said first and second areas by etching prior to said planarizing step, and
   completing said integrated circuit.

4. A method for planarizing a surface having structures formed thereon and an additional layer of material covering said surface and said structures formed on said surface, said method including steps of
   applying a planarizing material to said additional layer of material to form a substantially planar surface above said surface having structures formed thereon, and
   performing a non-selective etching from said substantially planar surface to a said structure formed thereon, wherein
   said structures have a first average height in a first area of said surface and structures of a second average height greater than said first average height in a second area of said surface, said method comprising the further steps of
   etching said structures of said second average height to an average height substantially equal to said first average height,
   subsequent to said etching step, applying a planarizing material to said first and second areas of said surface and covering said structures remaining in said first and second areas whereby a surface of said planarizing material is substantially planar, and
   performing said step of non-selectively etching said planarizing material and structures overlaid by said planarizing material to completely remove said planarizing material and form a planar surface.

* * * * *